United States Patent
Kotani et al.

(10) Patent No.: US 7,450,461 B2
(45) Date of Patent: Nov. 11, 2008

(54) SEMICONDUCTOR MEMORY DEVICE AND TRANSMISSION/RECEPTION SYSTEM PROVIDED WITH THE SAME

(75) Inventors: Hisakazu Kotani, Hyogo (JP); Motonobu Nishimura, Shiga (JP); Kazuyo Nishikawa, Osaka (JP); Masahiro Ueminami, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 272 days.

(21) Appl. No.: 11/543,227

(22) Filed: Oct. 5, 2006

(65) Prior Publication Data

US 2007/0081398 A1   Apr. 12, 2007

(30) Foreign Application Priority Data

Oct. 7, 2005  (JP) ............................ 2005-294725
Aug. 9, 2006  (JP) ............................ 2006-216755

(51) Int. Cl.
*G11C 8/00* (2006.01)

(52) U.S. Cl. ..................... 365/230.01; 365/230.02; 365/230.04; 365/230.08

(58) Field of Classification Search ............ 365/230.01, 365/230.02, 230.04, 230.08
See application file for complete search history.

(56) References Cited

U.S. PATENT DOCUMENTS

| | | | | |
|---|---|---|---|---|
| 5,930,197 | A | * | 7/1999 | Ishibashi et al. ......... 365/233.1 |
| 6,469,951 | B2 | * | 10/2002 | Toda .................... 365/230.03 |
| 2001/0036109 | A1 | | 11/2001 | Jha et al. |

FOREIGN PATENT DOCUMENTS

| | | |
|---|---|---|
| JP | 2003-7052 A | 1/2003 |
| JP | 2004-273117 A | 9/2004 |

* cited by examiner

*Primary Examiner*—Pho M. Luu
(74) *Attorney, Agent, or Firm*—McDermott Will & Emery LLP

(57) ABSTRACT

In a system of using a plurality of memories with a plurality of CPUs, a plurality of memory arrays are placed on the same memory chip with each memory array being individually provided with a data-related circuit, an address-related circuit and a control-related circuit. These memory arrays however share a data terminal, an address terminal and a control terminal for chip external connection. A data, address and control signals are distributed to the memory arrays via three MUX of signal selection circuits controlled with an array selection signal (clock). A signal is supplied to one memory array at rising timing of the clock while a signal is supplied to another memory array at falling timing of the clock. Thus, in memory integration of placing a plurality of memory arrays on one chip, independent operation for each memory array is attained, and no bus arbitration between CPUs is necessary.

26 Claims, 25 Drawing Sheets

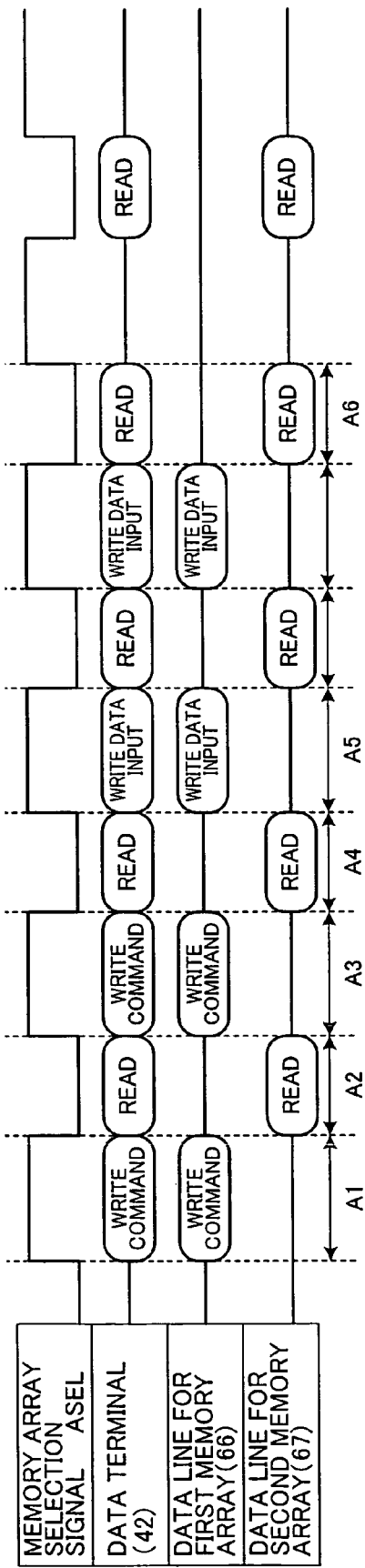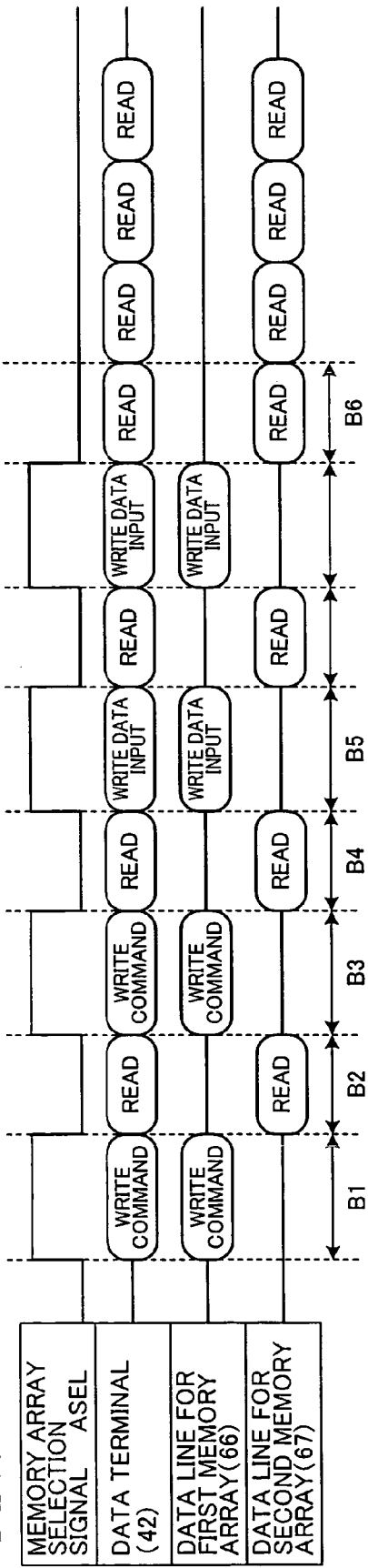

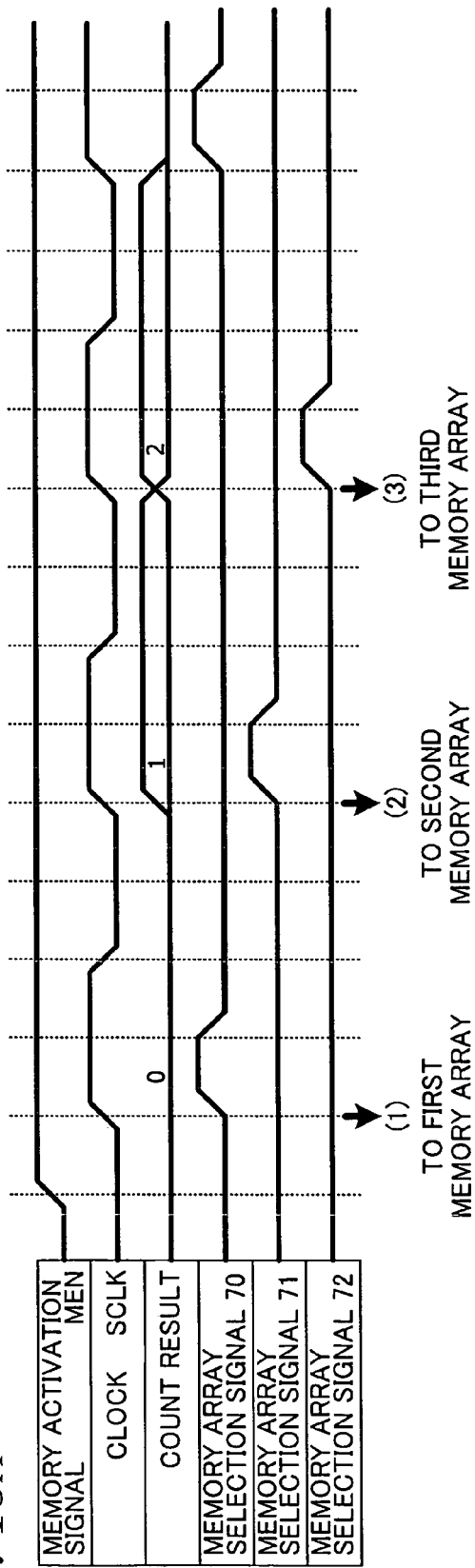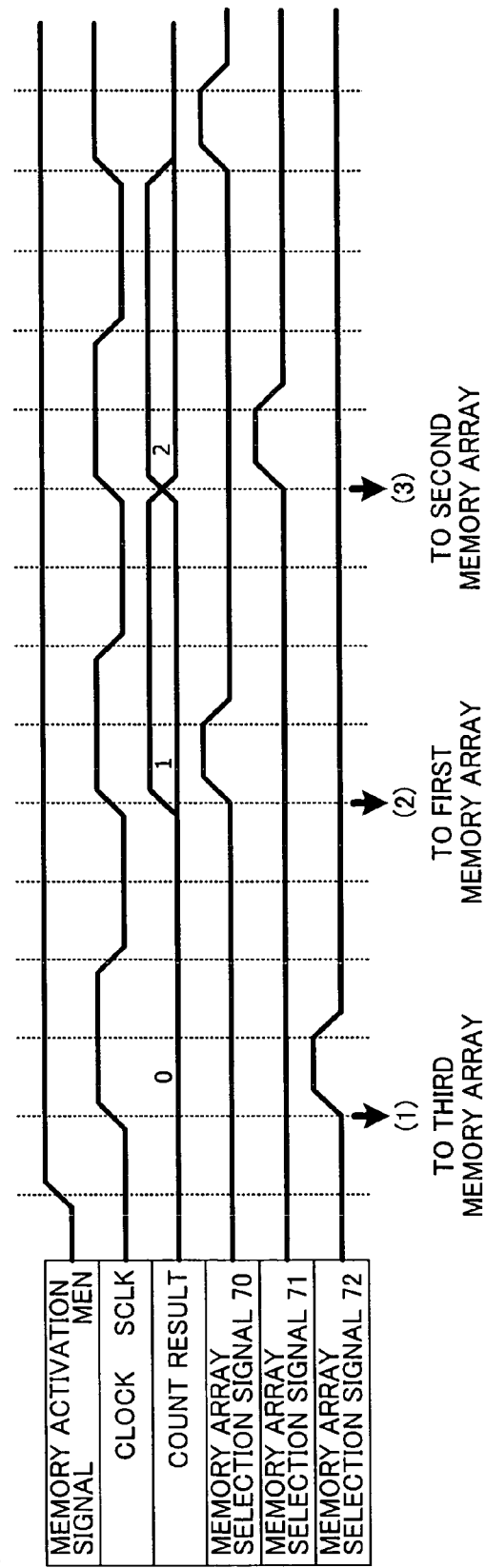

SEMICONDUCTOR MEMORY DEVICE AND TRANSMISSION/RECEPTION SYSTEM PROVIDED WITH THE SAME

CROSS-REFERENCE TO RELATED APPLICATIONS

This non-provisional application claims priority under 35 U.S.C. §119(a) on Patent Application No. 2005-294725 filed in Japan on Oct. 7, 2005, and Patent Application No. 2006-216755 filed in Japan on Aug. 9, 2006, the entire contents of which are hereby incorporated by reference.

BACKGROUND OF THE INVENTION

The present invention relates to semiconductor memory devices that are used as memory devices for cellular phones, personal digital assistants (PDAs), video information processing devices and the like, have nonvolatile memory cells, and are controlled with a plurality of information processing devices.

In electrically reprogrammable nonvolatile semiconductor memory devices, recently, flash memories permitting one-time erasure in a block or chip unit have been adopted in various fields. Such flash memories have two types: NOR flash memories suitable for storing programs, and NAND flash memories suitable for storing data. NOR flash memories feature high-speed random read, while NAND flash memories feature high-speed write/low-speed random read and large capacity.

Taking advantage of the above features, flash memories are applied to equipment in a variety of fields. For example, cellular phones are composed of a baseband section responsible for transmission/reception of waves and signals and an application section responsible for processing of multimedia such as images and music. The baseband section uses NOR flash memories as memories for storing programs for baseband processing. The application section uses both NOR flash memories for storing various programs as in the baseband section and NAND flash memories for storing a large volume of data such as music and images.

Presently, peripheral equipment for these memories, processors and the like is mounted on a separate chip depending on its use, as in a system shown in FIG. 21. In the system of FIG. 21, a memory chip 1 and a CPU 1 are responsible for high-speed random access read operations, while a memory chip 2 and a CPU 2 are responsible for large-volume data rewrite and low-speed random read (normally, serial access read) operations.

Systems including that described above have been asked for cost reduction as a recent trend. In response to this, integration of a plurality of chips is now being sought to reduce the number of components and thus to reduce the cost. Integration of information processing devices such as processors is first being attempted. Memories are yet mounted on separate chips in the conventional manner. With the recent progress in the technologies for smaller size and larger capacity, however, integration of memories of different types is increasingly becoming technically practicable. In future, therefore, integration of memories is desired.

As a technique for integrating memories, it is contemplated that memory arrays of different types such as the NOR type and the NAND type, for example, would be mounted on the same chip as they are.

Conventionally, in some instances, integration of a plurality of memory arrays has been made, as in Japanese Laid-Open Patent Publication No. 2004-273117 (Literature 1). In such instances, a plurality of memory arrays, mounted on the same chip, share a data terminal, an address terminal and a control terminal among them, to permit read operation to be performed during execution of write operation.

In Japanese Laid-Open Patent Publication No. 2003-7052 (Literature 2), also, two memory arrays are mounted on the same chip and share a control circuit therebetween, to permit data to be read from the two memory arrays in synchronization with 'H' and 'L' periods of a memory sync clock and sent to two memory peripheral devices.

However, the conventional techniques have the following problems. In Literature 1, address and data inputs/outputs (I/Os) are provided individually for the two memory arrays, while write control and read control are shared between the two arrays. Therefore, as shown in FIG. 22, read operation can be executed only after termination of write command input and write data input. More specifically, a write command is decrypted with a system control instruction register in Literature 1 (the period "write command" in FIG. 22), all of write data is captured into a data latch (the period "write data input" in FIG. 22), and then the data is written in a memory array (the period at and after "write start" timing in FIG. 22). Since the write time and erase time of flash memories are slow in general, array peripheral equipment under the write operation is likely to stand idle and thus is ready to execute a mode operable in a short time such as read operation. Therefore, in FIG. 22, after the write start, the system control instruction register in Literature 1 controls the chip to read data from the other memory array (the period "read" in FIG. 22) so as to execute read operation.

As described above, Literature 1 has the problem that during the period of write data input, in which the control circuit is in the write state and data is being written in the data latch, it is unable to cut in and execute read operation.

In Literature 2, also, since the control circuit is shared between the two memory arrays, it is unable to perform read operation during execution of write operation.

In general, besides the problem in Literatures 1 and 2 described above, there is a problem associated with integration of a plurality of memories on one chip. That is, the control terminal, the address terminal and the data terminal are required individually for each of a plurality of processors using the memories, and this multiplies the number of pins required by the number of processors. This increases the memory chip area, blocks the trend toward cost reduction, and also increases power consumption with the increase in the number of pins.

A problem also arises once memories are integrated to give a one-chip memory. In the case that two information processing devices use one memory, competition at accessing the memory that may occur between the two information processing devices must be adjusted. This will increase the burden on the information processing devices for arbitration between the plurality of information processing devices.

SUMMARY OF THE INVENTION

An object of the present invention is providing a semiconductor memory device in which a plurality of memory arrays are mounted on the same chip and a plurality of information processing devices can transmit/receive signals to/from the memory during desired time periods with a reduced number of pins.

The semiconductor memory device of the present invention is a one-chip semiconductor memory device transmitting/receiving a data signal, an address signal and a control signal to/from a plurality of information processing devices.

The device includes a plurality of memory arrays each having an array of a plurality of nonvolatile memory cells in the chip; a plurality of sets of data terminals, address terminals and control terminals and data-related circuits, address-related circuits and control-related circuits provided individually for the plurality of memory arrays; one set of a data terminal, address terminal and control terminal placed in an input/output buffer portion at a chip external interface, the one set being shared among the plurality of memory arrays; and a plurality of signal selection circuits placed between the one set of a data terminal, address terminal and control terminal and the plurality of sets of data terminals, address terminals and control terminals and data-related circuits, address-related circuits and control-related circuits, wherein one or a plurality of array selection signals for selecting any of the plurality of memory arrays are input into the plurality of signal selection circuits via the input/output buffer portion, and signals from the one set of a data terminal, address terminal and control terminal are distributed to any of the plurality of memory arrays via the plurality of signal distribution circuits.

With the above configuration, in the semiconductor memory device of the present invention, each memory array has its own address-related circuit, control-related circuit and data-related circuit independently. Thus, independent operation for each memory array can be attained.

In one embodiment of the semiconductor memory device of the invention, a plurality of sets of data signals, address signals and control signals are input or output at the data terminal, the address terminal and the control terminal in the input/output buffer portion in a time-division manner.

Accordingly, in the semiconductor memory device described above, data write and read are performed alternately, and thus it is no more necessary for an array ready for read to wait during input of a large amount of write data as in the conventional case. The wait time can therefore be shortened.

In another embodiment of the semiconductor memory device of the invention, a clock input into the plurality of information processing devices is input into the plurality of signal distribution circuits as the array selection signal, and the plurality of signal distribution circuits distribute signals so that a data input signal, an address signal and a control signal input into the input/output buffer portion are supplied to a first memory array as one of the plurality of memory arrays at rising or falling timing of the clock, a data input signal, an address signal and a control signal input into the input/output buffer portion are supplied to a second memory array as another memory array at falling or rising timing of the clock, and data from the first memory array is output from the input/output buffer portion at subsequent rising or falling timing of the clock, and data from the second memory array is output from the input/output buffer portion at subsequent falling or rising timing of the clock.

Accordingly, the semiconductor memory device described above selects a memory array at a rising or falling edge of the clock. This eliminates the necessity of bus arbitration among a plurality of information processing devices.

In yet another embodiment of the semiconductor memory device of the invention, a clock input into the plurality of information processing devices is input into the plurality of signal distribution circuits as the array selection signal, and the plurality of signal distribution circuits distribute signals so that a data input signal and an address signal input into the input/output buffer portion are supplied to a first memory array as one of the plurality of memory arrays, while a control signal input into the input/output buffer portion is supplied to a second memory array as another memory array, at rising or falling timing of the clock, a data input signal and an address signal input into the input/output buffer portion are supplied to the second memory array, while a control signal input into the input/output buffer portion is supplied to the first memory array, at falling or rising timing of the clock, and data from the first memory array is output from the input/output buffer portion at subsequent rising or falling timing of the clock, and data from the second memory array is output from the input/output buffer portion at subsequent falling or rising timing of the clock.

Accordingly, in the semiconductor memory device described above, the control signal and the address signal/data signal are shifted by a half cycle of the clock, and this facilitates the timing design of capture of commands and addresses on the side of the memory chip and capture of data on the side of the information processing devices.

In yet another embodiment of the semiconductor memory device of the invention, a clock input into the plurality of information processing devices and a memory activation signal output from any of the plurality of information processing devices are supplied, a count circuit controlled with the memory activation signal and the clock is provided in the chip, the count circuit counts the clock after the input of the memory activation signal, generates a plurality of kinds of memory array selection signals according to the count number, and transmits the generated signals to the plurality of signal distribution circuits, and the plurality of signal distribution circuits are controlled with the plurality of kinds of memory array selection signals.

Accordingly, in the semiconductor memory device described above, two or more memory arrays can be selected.

The transmission/reception system of the present invention includes: the semiconductor memory device described above; and a plurality of information processing devices connected to the semiconductor memory device, wherein the count circuit receives the memory activation signal and counts the clock after the input of the memory activation signal, and the plurality of signal distribution circuits distribute signals so that signal transmission/reception is made between any one of the plurality of information processing devices and the semiconductor memory device in a cycle every predetermined number of cycles of the clock based on the clock count result from the count circuit, and signal transmission/reception is made between another information processing device and the semiconductor memory device in a subsequent cycle of the clock.

In yet another embodiment of the semiconductor memory device of the invention, a clock input into the plurality of information processing devices and a memory activation signal output from any of the plurality of information processing devices are supplied, a clock multiplication circuit for multiplying the frequency of the clock and a count circuit controlled with the memory activation signal and a multiplied clock from the clock multiplication circuit are provided in the chip, the count circuit counts the multiplied clock after the input of the memory activation signal, generates a plurality of kinds of memory array selection signals according to the count number, and transmits the generated signals to the plurality of signal distribution circuits, and the plurality of signal distribution circuits are controlled with the plurality of kinds of memory array selection signals.

Accordingly, in the semiconductor memory device described above, in which the clock is multiplied, higher-speed memory array allocation can be attained.

Alternatively, the transmission/reception system of the present invention includes: the semiconductor memory device described above; and a plurality of information processing devices connected to the semiconductor memory device, wherein each of the information processing devices has the clock multiplication circuit and the count clock, the clock multiplication circuit multiplies the cycles of the input clock, the count circuit receives the memory activation signal and counts the multiplied clock after the input of the memory activation signal, and the plurality of signal distribution circuits distribute signals so that signal transmission/reception is made between any one of the plurality of information processing devices and the semiconductor memory device in a cycle every predetermined number of cycles of the multiplied clock based on the count result of the multiplied clock from the count circuit, and signal transmission/reception is made between another information processing device and the semiconductor memory device in a subsequent cycle of the multiplied clock.

Alternatively, the transmission/reception system of the present invention includes: the semiconductor memory device described above; and a plurality of information processing devices connected to the semiconductor memory device, wherein the semiconductor memory device receives a clock, a memory activation signal is transmitted from a first information processing device among the plurality of information processing devices to the semiconductor memory device and the other information processing device or devices, the semiconductor memory device has a clock multiplication circuit for multiplying the frequency of the clock and a count circuit for receiving the multiplied clock from the clock multiplication circuit, the multiplied clock from the clock multiplication circuit is transmitted to the plurality of information processing devices, the count circuit of the semiconductor memory circuit counts the multiplied clock after the input of the memory activation signal, generates a plurality of kinds of memory array selection signals according to the count number and transmits the generated signals to the plurality of signal distribution circuits, and the plurality of signal distribution circuits are controlled with the plurality of kinds of memory array selection signals, so that signal transmission/reception is made between the semiconductor memory device and the plurality of information processing devices.

Accordingly, in the transmission/reception system of the invention, in which no clock multiplication circuit is necessary for the information processing devices, the area of the information processing devices can be reduced.

In yet another embodiment of the semiconductor memory device of the invention, the plurality of information processing devices have a count circuit, the count circuit receives the multiplied clock from the clock multiplication circuit of the semiconductor memory device and counts the multiplied clock after the input of the memory activation signal, and the plurality of signal distribution circuits distribute signals so that signal transmission/reception is made between any one of the plurality of information processing devices and the semiconductor memory device in a cycle every predetermined number of cycles of the multiplied clock based on the count result of the clock by the count circuit, and signal transmission/reception is made between another information processing device and the semiconductor memory device in a subsequent cycle of the multiplied clock.

In yet another embodiment of the semiconductor memory device of the invention, the count circuit counts the clock or a multiplied clock without receiving the memory activation signal, generates the plurality of kinds of memory array selection signals according to the count number, and transmits the generated signals to the plurality of signal distribution circuits, and the plurality of signal distribution circuits are controlled with the plurality of kinds of memory array selection signals.

Accordingly, in the semiconductor memory device described above, in which no memory activation signal is necessary, the number of pins on the memory chip can be reduced.

In yet another embodiment of the semiconductor memory device of the invention, the count circuit counts the clock or a multiplied clock without receiving the memory activation signal, and the plurality of signal distribution circuits distribute signals so that signal transmission/reception is made between any one of the plurality of information processing devices and the semiconductor memory device in a cycle every predetermined number of cycles of the multiplied clock based on the count result of the clock from the count circuit, and signal transmission/reception is made between another information processing device and the semiconductor memory device in a subsequent cycle of the multiplied clock.

In yet another embodiment of the semiconductor memory device of the invention, the device further includes a status setting circuit for receiving a signal group from the data terminal, the address terminal and the control terminal in the input/output buffer portion and varying the relationship between the count number in the count circuit and the generation of the memory array selection signals according to the signal group, and the output of the status setting circuit is given to the count circuit.

Accordingly, in the semiconductor memory device described above, in which the relationship between the count number from the count circuit and the memory array selection signals can be varied, the order of the access to the memory arrays can be changed, and thus the memories can be accessed in a desired order depending on the operation mode.

In yet another embodiment of the semiconductor memory device of the invention, a control signal is transmitted from any of the plurality of information processing devices to the status setting circuit via the data terminal, the address terminal and the control terminal, and the contents of the status setting circuit are changed with the control signal.

In yet another embodiment of the semiconductor memory device of the invention, a memory activation signal is transmitted from one of the plurality of information processing devices to the semiconductor memory device and the other information processing device or devices, and the plurality of signal distribution circuits perform signal transmission/reception between the plurality of information processing devices and the plurality of memory arrays based on the memory activation signal, so that a data input signal, an address signal and a control signal input into the input/output buffer portion are supplied to one memory array during an 'H' or 'L' period of the memory activation signal, while a data input signal, an address signal and a control signal input into the input/output buffer portion are supplied to another memory array during an 'L' or 'H' period of the memory activation signal, and data from the one memory array is output from the input/output buffer portion during a subsequent 'H' or 'L' period of the memory activation signal, while data from the another memory array is output from the input/output buffer portion during a subsequent 'L' or 'H' period of the memory activation signal.

Accordingly, in the semiconductor memory device described above, the memory arrays can be selected during an arbitrary period, not a period determined with the clock cycle.

In yet another embodiment of the semiconductor memory device of the invention, the plurality of signal distribution circuits distribute signals so that a data input signal, an address signal and a control signal input into the input/output buffer portion are supplied to one memory array at rising or falling timing of the memory activation signal, while a data input signal, an address signal and a control signal input into the input/output buffer portion are supplied to another memory array at falling or rising timing of the memory activation signal, the signals input into the input/output buffer portion are held in the two memory arrays until the next rising or falling shift, and data from the one memory array is output from the input/output buffer portion at rising or falling timing of the memory activation signal, while data from the another memory array is output from the input/output buffer portion at falling or rising timing of the memory activation signal.

In yet another embodiment of the semiconductor memory device of the invention, during the period when the memory activation signal transmitted from the one information processing device is being activated, signal transmission/reception between the other information processing device or devices and the semiconductor memory device is not performed.

In yet another embodiment of the semiconductor memory device of the invention, a memory activation signal is transmitted from each of the plurality of information processing devices to the semiconductor memory device, and the plurality of signal distribution circuits are respectively controlled with the plurality of memory activation signals, so that a data input signal, an address signal and a control signal input into the input/output buffer portion are supplied to one memory array during an 'H' or 'L' period of one of the plurality of the memory activation signals, and data from the one memory array is output from the input/output buffer portion, while a data input signal, an address signal and a control signal input into the input/output buffer portion are supplied to another memory array during an 'H' or 'L' period of another one of the plurality of the memory activation signals, and data from the another memory array is output from the input/output buffer portion.

Accordingly, in the semiconductor memory device described above, two or more memory arrays can be selected.

In yet another embodiment of the semiconductor memory device of the invention, a memory activation signal is transmitted from each of the plurality of information processing devices to the semiconductor memory device, and the plurality of signal distribution circuits are respectively controlled with the plurality of memory activation signals, so that a data input signal, an address signal and a control signal input into the input/output buffer portion are supplied to one memory array at falling or rising timing of one of the plurality of the memory activation signals, the signals supplied to the one memory array are held in the one memory array until the next rising or falling shift of the one memory activation signal, and data from the one memory array is output from the input/output buffer portion, while a data input signal, an address signal and a control signal input into the input/output buffer portion are supplied to another memory array at falling or rising timing of another one of the plurality of the memory activation signals, the signals supplied to the another memory array are held in the another memory array until the next rising or falling shift of the another memory activation signal, and data from the another memory array is output from the input/output buffer portion.

Alternatively, the transmission/reception system of the invention includes: the semiconductor memory device described above; and the plurality of information processing devices, wherein a memory access request signal is transmitted to a first information processing device among the plurality of information processing devices from each of the other information processing device or devices, a memory busy signal is transmitted from the first information processing device to each of the other information processing device or devices, and the other information processing device or devices that have received the memory busy signal from the first information processing device do not activate the memory activation signal and thus do not perform signal transmission/reception.

Alternatively, the transmission/reception system of the invention includes: the semiconductor memory device described above; and the plurality of information processing devices, wherein the semiconductor memory device includes a timer circuit, the timer circuit generates a memory array switch signal having a pulse of a predetermined width in a predetermined cycle, and outputs the signal to the plurality of information processing devices, and in the plurality of information processing devices, during the time when the memory array switch signal is being activated, the state of a memory activation signal generated by any of the information processing devices is shifted, and output signals from all the information processing devices to the semiconductor memory device are fixed to 'H', 'L' or high impedance.

Accordingly, the transmission/reception system of the invention can prevent occurrence of a malfunction such as a power supply through current due to a collision between output signals from the information processing devices at the time of switching of one memory array to another.

In yet another embodiment of the semiconductor memory device of the invention, the plurality of signal distribution circuits are placed, not in the vicinity of the input/output buffer portion at the chip external interface, but at positions near the plurality of memory arrays on the chip.

Accordingly, in the semiconductor memory device described above, the signal distribution circuits are placed near the corresponding memory arrays. This can shorten the length of data lines, address lines and control signal lines after the distribution, reduce the wiring layout region, and thus reduce the chip area.

In yet another embodiment of the semiconductor memory device of the invention, the device further includes an array selection control circuit for generating a signal for controlling to distribute signals from the one set of a data terminal, address terminal and control terminal to any of the plurality of memory arrays via the plurality of signal distribution circuits, wherein in use of the semiconductor memory device, the array selection control circuit is configured to receive signals from the data terminal, the address terminal and the control terminal, generate an array selection signal for selecting one memory array among the plurality of memory arrays, and transmit the array selection signal to the signal distribution circuits in advance, and if the memory array selected in advance with the array selection control circuit is accessed externally, access to the other memory array or arrays is not accepted, and only when the memory array selected in advance is not being accessed, access to the other memory array or arrays is accepted, thus performing selection giving high priority to one memory array.

Accordingly, in the semiconductor memory device described above, no external array selection signal is used, and thus the number of pins can be reduced. Also, different arrays can be used with no arbitration on array selection being made in the system. That is, memory array selection can be executed with no array selection signal being generated, and thus the burden related to controlling the entire system can be alleviated.

In yet another embodiment of the semiconductor memory device of the invention, a clock input into the plurality of information processing devices is input into the plurality of signal distribution circuits as the array selection signal, and the plurality of signal distribution circuits distribute signals so that a data input signal, an address signal and a control signal input into the input/output buffer portion are supplied to a first memory array as one of the plurality of memory arrays during an 'H' or 'L' period of the clock, while in a second memory array as another memory array, a previously-input signal is held, a data input signal, an address signal and a control signal input into the input/output buffer portion are supplied to the second memory array during an 'L' or 'H' period of the clock, while in the first memory array, a previously-input signal is held, and data from the first memory array is output from the input/output buffer portion during an 'H' or 'L' period of the clock, while data from the second memory array is output from the input/output buffer portion during an 'L' or 'H' period of the clock.

Accordingly, in the semiconductor memory device described above, access to only one array can be made by fixing the clock to either the 'H' or 'L' level. Also, since the memory array is selected with an 'H' period or 'L' period of the clock, no bus arbitration between the plurality of information processing devices is necessary. Thus, the device is useful for systems using memories with a plurality of information processing devices.

In yet another embodiment of the semiconductor memory device of the invention, the device has n (n is an integer equal to or more than 2) memory arrays, and n signal distribution circuits for address signal, n signal distribution circuits for data signal and n signal distribution circuits for control signal respectively provided for the n memory arrays, the device further includes a memory capacity setting circuit, in use of the semiconductor memory device, the memory capacity setting circuit is configured to receive signals from the data terminal, the address terminal and the control terminal, and transmit array selection signals to the signal distribution circuits so that one memory array or a plurality of memory arrays having a desired memory capacity are made up from the n memory arrays based on the input signals in advance, and the memory capacity setting circuit transmits n array selection signals to the n signal distribution circuits each for address signal, data signal and control signal to select a memory array having a desired memory capacity.

Accordingly, in the semiconductor memory device described above, the capacity of each of the plurality of memory arrays can be set arbitrarily. By partitioning the inside of the chip depending on various cases, therefore, the memories can be used without waste.

In yet another embodiment of the semiconductor memory device of the invention, the memory capacity setting circuit is divided into a plurality of circuits, the plurality of memory capacity setting circuits are placed, not in the vicinity of the input/output buffer portion at the chip external interface, but at positions near the plurality of memory arrays on the chip.

Accordingly, in the semiconductor memory device described above, a plurality of memory capacity setting circuits are placed near the corresponding memory arrays dispersively on the memory chip. This can reduce the wiring layout region for memory capacity setting signals and thus reduce the chip area.

BRIEF DESCRIPTION OF THE DRAWINGS

FIGS. 2A and 2B are operation sequence diagrams of a semiconductor memory device of Embodiment 2, in which FIG. 2A shows the case of selecting two memory arrays with a periodic memory array selection signal, and FIG. 2B shows the case of selecting two memory arrays with a signal from a first COU.

FIG. 15A is an operation sequence diagram of the semiconductor memory device of Embodiment 9, and FIG. 15B is another operation sequence diagram thereof.

DESCRIPTION OF THE PREFERRED EMBODIMENTS

Hereinafter, preferred embodiments of the present invention will be described with reference to the accompanying drawings.

Embodiment 1

Figure 1:
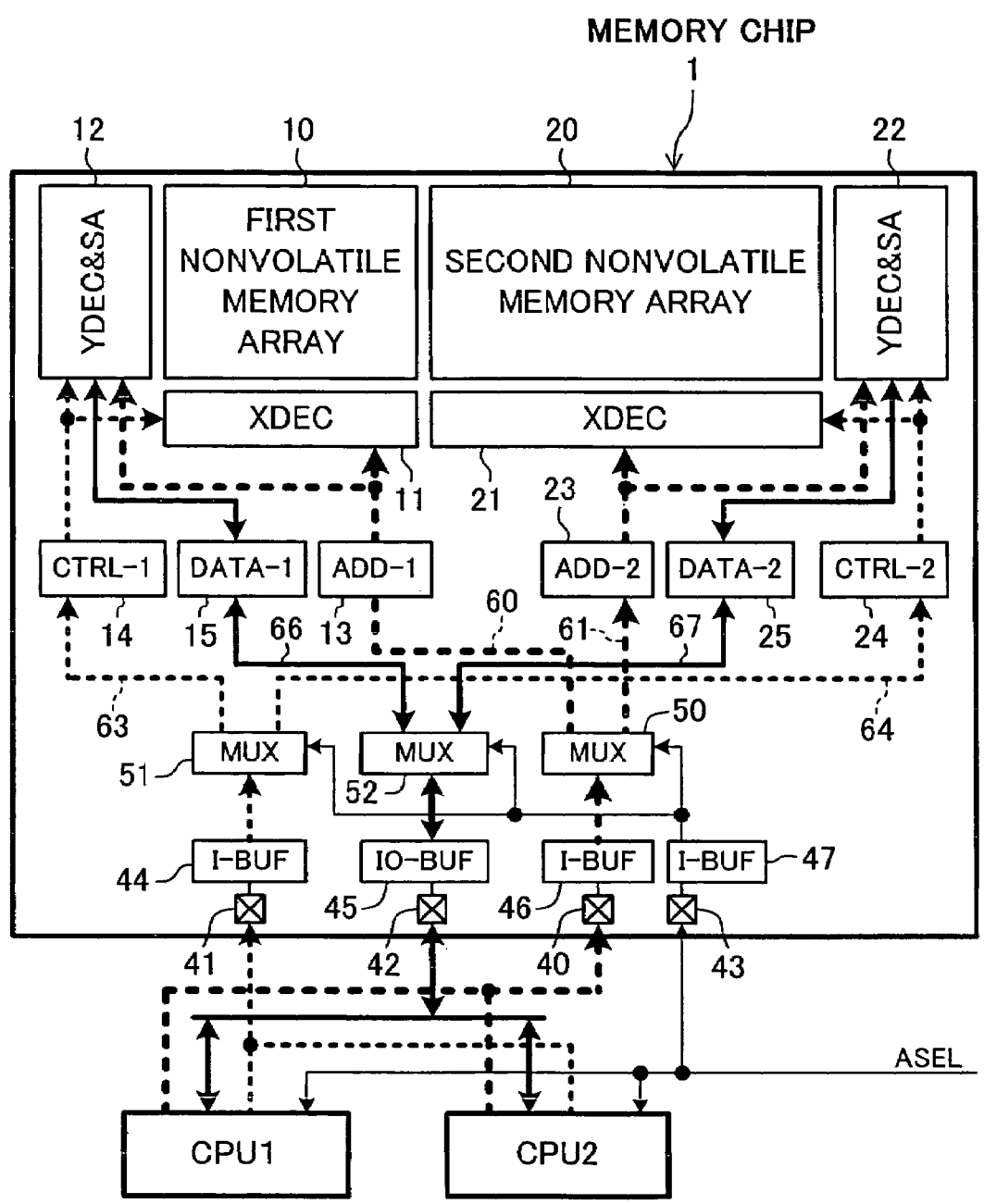
FIG. 1 is a block diagram of a semiconductor memory device of Embodiment 1.

FIG. 1 is a block diagram of a semiconductor memory device of Embodiment 1 of the present invention.

The semiconductor memory device shown in FIG. 1 has two CPUs, CPU1 and CPU2, placed externally as information processing devices.

Within a memory chip 1, two nonvolatile memory arrays 10 and 20 each made of an array of a plurality of nonvolatile memory cells are placed. For each memory array 10, 20, provided are a row decoder XDEC 11, 21 for selecting a word line and a sense amplifier/column decoder YDEC&SA 12, 22 for selecting a bit line and amplifying data. Also, for the memory array 10, provided are an address-related circuit ADD-1 13, a control-related circuit CTRL-1 14 and a data-related circuit DATA-1 15. Likewise, for the memory array 20, provided are an address-related circuit ADD-2 23, a control-related circuit CTRL-2 24 and a data-related circuit DATA-2 25.

A single-route address terminal 40, control terminal 41 and data terminal 42 are placed in an interface portion of the memory chip 1 interfacing the outside of the chip, from which terminals lines extend up to signal distribution circuits MUX 50, 51 and 52 via input buffers IBUF 46 and 44 and an I/O buffer IOBUF 45. A memory array selection signal ASEL is input into the memory chip 1 and supplied to the signal distribution circuits 50, 51 and 52 via a terminal 43 and an input buffer IBUF 47.

From the three signal distribution circuits MUX, signal line groups 60, 61, 63, 64, 66 and 67 for the memory arrays 10 and 20 extend to be connected to the address-related circuits 13 and 23, the control-related circuits 14 and 24, and the data-related circuits 15 and 25.

Signal line groups from the CPU1 and CPU2 for the memory are shared as illustrated, and connected to the terminals 40, 41 and 42 of the memory chip 1. The memory array selection signal ASEL is input, not only into the memory chip 1, but also into the CPU1 and CPU2.

Hereinafter, signal transmission/reception between the CPU1, CPU2 and the memory array 10, 20 will be described.

On the memory chip 1, the three signal distribution circuits MUX are controlled to transmit signals to the first or second memory cell 10, 20 depending on the state of the memory array selection signal ASEL. For example, if the memory array selection signal ASEL is 'H', signals are transmitted to the address-related circuit 13, the control-related circuit 14 and the data-related circuit 15 for the first memory array 10. Contrarily, if the memory array selection signal ASEL is 'L', signals are transmitted to the address-related circuit 23, the control-related circuit 24 and the data-related circuit 25 for the second memory array 20. As for the CPU, the CPU1 transmits a signal to the memory chip 1 if the memory array selection signal ASEL is 'H', while the CPU2 transmits a signal to the memory chip 1 if the memory array selection signal ASEL is 'L'.

By configuring as described above, signal transmission/reception can be made between the CPU1, CPU2 and the memory array 10, 20 depending on the state of the memory array selection signal ASEL. Moreover, with the provision of the three signal distribution circuits MUX, while one of the memory arrays 10, 20 is being selected, no signal is transmitted/received to/from the other memory array 20, 10. Furthermore, with the address-related circuit, the control-related circuit and the data-related circuit individually provided for each memory array, commands from the CPU1 and CPU2 can be decrypted separately. Thus, data can be read from one memory array while write data is being input, for example.

As described above, in this embodiment, since each memory array is provided with its dedicated address-related circuit, control-related circuit and data-related circuit, independent operation is allowed for each memory array. This embodiment is therefore useful for cases of using a plurality of memory arrays among a plurality of information processing devices.

Embodiment 2

FIGS. 2A and 2B are operation sequence diagrams of a semiconductor memory device of Embodiment 2 of the present invention.

FIGS. 2A and 2B specifically show the operations of the memory array selection signal ASEL, the data terminal 42, the data line 66 for the first memory array 10 and the data line 67 for the second memory array 20 shown in FIG. 1, in which FIG. 2A shows the case that the memory array selection signal ASEL is a periodic signal like a clock and FIG. 2B shows the case that the signal ASEL is not a periodic signal. In the illustrated examples, if the memory array selection signal ASEL is 'H', data is transmitted from the data terminal 42 to the first memory array 10 via the corresponding signal distribution circuit MUX. If the memory array selection signal ASEL is 'L', data is transmitted from the data terminal 42 to the second memory array 20 via the signal distribution circuit MUX.

In the case of FIG. 2A, a write command is transmitted during period A1, and read from the second memory array 20 is executed during period A2. Write data is transmitted during periods A3 and A5, and read from the second memory array 20 is executed during the in-between period A4. During and after period A6, the first memory array 10 is in the write state with no signal being exchanged with outside, and thus read from the second memory array 20 is only executed.

The above operation sequence also applies to the case of FIG. 2B. Read from the second memory array 20 is only executed during and after period B6. In this case, however, since the memory array selection signal ASEL is not periodic unlike the case of FIG. 2A, the second memory array 20 is continuously selected to enable retrieval of read data without interruption.

Figure 22:
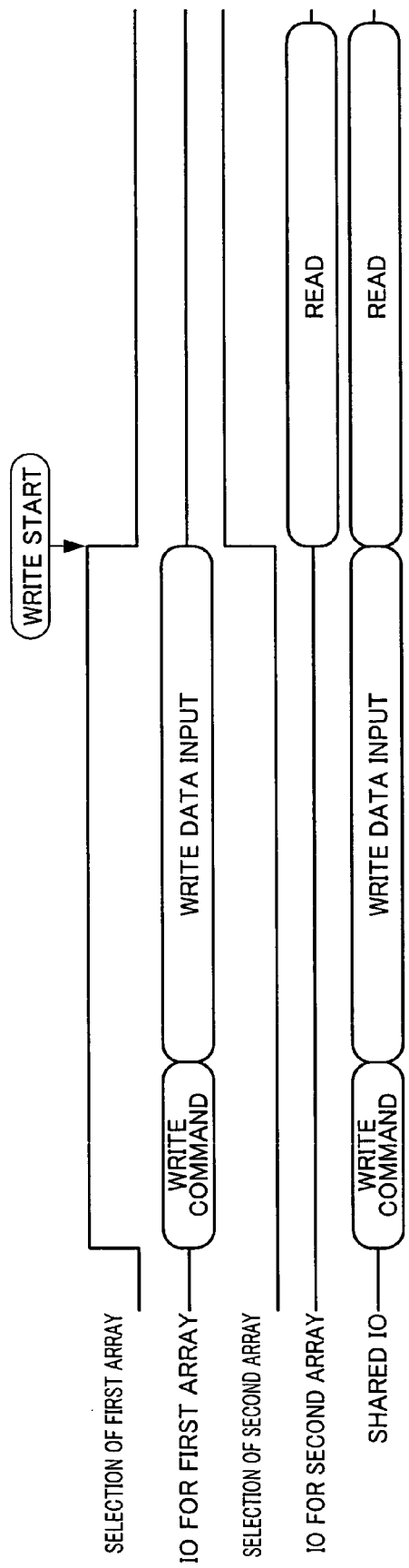
FIG. 22 is an operation sequence diagram of the conventional semiconductor memory device.

Although not shown, substantially the same timing also applies to the address terminal and the control terminal. Signal transmission/reception for the first and second memory arrays 10 and 20 is made in the time-division manner as in FIGS. 2A and 2B. Also, as in period B4 in FIG. 2B, for example, it is possible to cut in and read data from the second memory array 20 while write data is being transmitted to the first memory array 10. Therefore, it is no more necessary to wait until all of write data has been input to read data from the other memory array, as in the conventional case shown in FIG. 22. The data amount that can be written at one time has increased with the recent attainment of a larger memory capacity. Therefore, the situation of waiting for a long time until write data has been input can be eliminated in this embodiment.

As described above, in this embodiment, a memory array subjected to read does not have to wait while a large volume of write data is being input, but data write and data read are performed alternately. The wait time can therefore be shortened, and thus this embodiment is useful for cases of executing write and read simultaneously.

Embodiment 3

Figure 3:
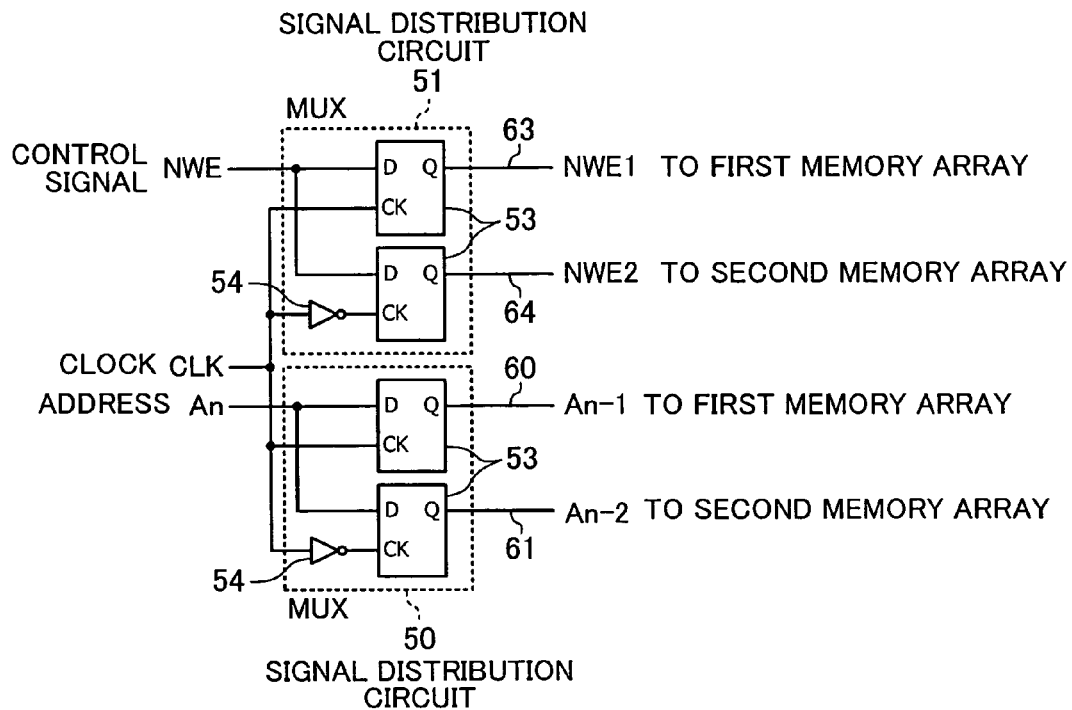
FIG. 3 is a view showing a signal distribution circuit of a semiconductor memory device of Embodiment 3.
Figure 4:
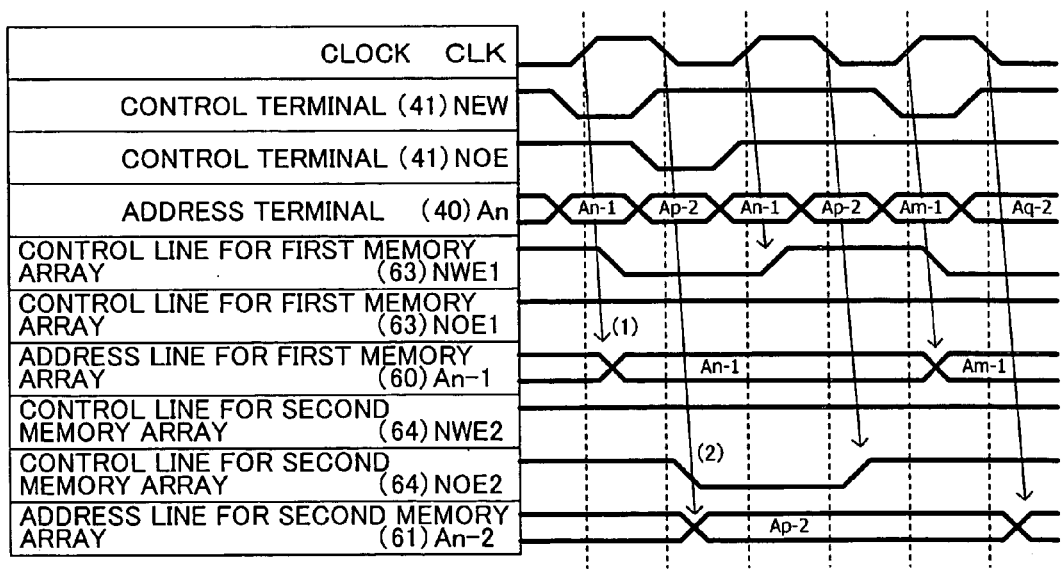
FIG. 4 is an operation sequence diagram of the semiconductor memory device of Embodiment 3.

FIG. 3 is a view showing signal distribution circuits of a semiconductor memory device of Embodiment 3 of the present invention. FIG. 4 is an operation sequence diagram observed when the signal distribution circuits in this embodiment are employed.

In this embodiment, a clock as a periodic signal is employed as the memory array selection signal ASEL. In FIG. 3, a control signal NWE is input into the signal distribution circuit 51, while an address signal An is input into the signal distribution circuit 50. In the example of FIG. 3, a clock CLK serves as the memory array selection signal ASEL for the signal distribution circuits 50 and 51. Each of the signal distribution circuits 50 and 51 includes flipflops 53 and an inverter 54. As shown in FIG. 3, in each of the circuits 50 and 51, the clock CLK for one of the flipflops 53 directed to the second memory array 20 is input into the flipflop 53 via the inverter 54. That is, both the signal distribution circuits 50 and 51 transmit a signal to the first memory array 10 at the rising edge of the clock CLK and transmit a signal to the second memory array 20 at the falling edge thereof.

FIG. 4 is a timing chart of the operations of the signal distribution circuits 50 and 51, in which the operations of control signals NWE and NOE and the address An are shown. As is found from FIG. 4, at the rising of the clock CLK, the states of the control terminal 41 and the address terminal 40 are captured, and the signals are transmitted to the first memory array 10. Likewise, at the falling of the clock CLK, the states of the control terminal 41 and the address terminal 40 are captured, and the signals are transmitted to the second memory array 20. In the example of FIG. 4, at timing (1), a control signal NWE1 on the control line 63 for the first memory array 10 shifts to 'L' while an address An-1 on the address line 60 shifts, and the shifted states are held until the next rising. At timing (2), a control signal NOE2 on the control line 64 for the second memory array 20 shifts to 'L' while an address Ap-2 on the address line 61 shifts, and the shifted states are held until the next falling. In this way, the control signals and the address signals are input independently for the first and second memory arrays 10 and 20, to enable the memory arrays to operate independently. Although not illustrated, naturally, the data terminal 42 performs data input/output in a manner similar to that described above.

In this embodiment, the clock CLK is input, not only into the memory chip 1, but also into the CPU1 and CPU2 shown in FIG. 1. The CPU1 and CPU2 may merely transmit/receive signals to/from the memory chip 1 in synchronization with the rising and falling timing of the clock CLK. No arbitration is therefore necessary between the CPU1 and CPU2 on the access to the memory chip 1.

As described above, in this Embodiment, the rising and falling edges of the clock are used to select one of the two memory arrays 10 and 20, and this eliminates the necessity of bus arbitration between a plurality of information processing devices (CPUs). Thus, this embodiment is useful for systems using memory among a plurality of information processing devices.

Embodiment 4

Figure 5:
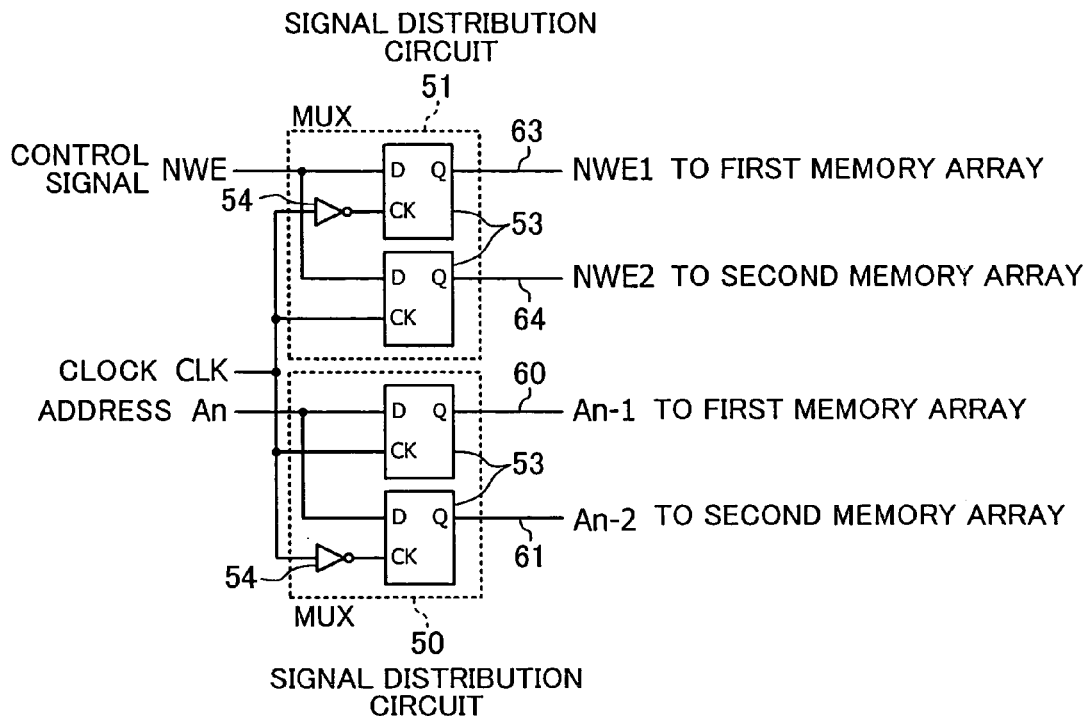
FIG. 5 is a view showing a signal distribution circuit of a semiconductor memory device of Embodiment 4.
Figure 6:
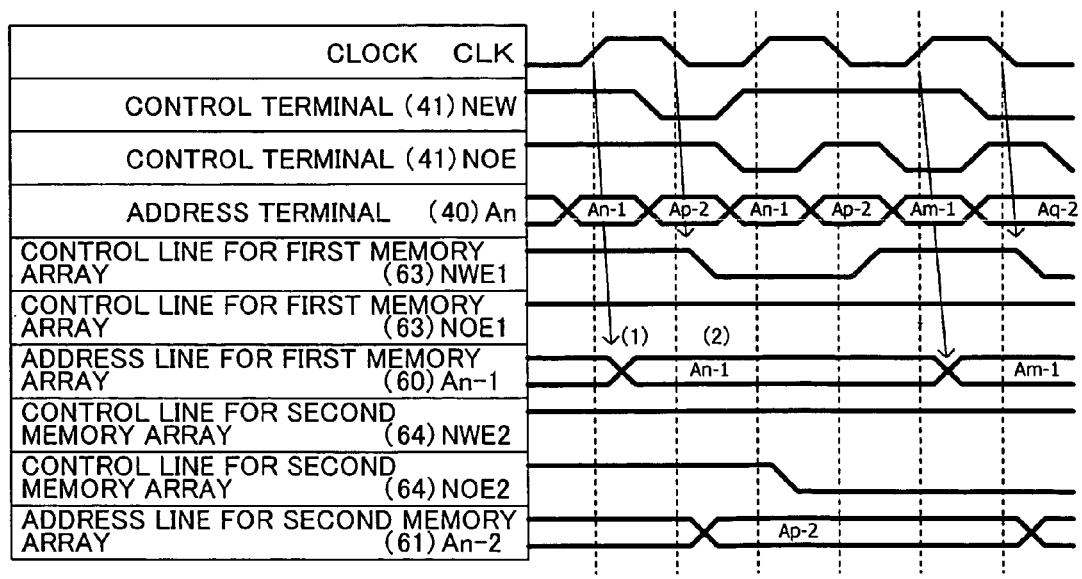
FIG. 6 is an operation sequence diagram of the semiconductor memory device of Embodiment 4.

FIG. 5 is a view showing signal distribution circuits of a semiconductor memory device of Embodiment 4 of the present invention. FIG. 6 is an operation sequence diagram observed when the signal distribution circuits in this embodiment are used.

In this embodiment, as in Embodiment 3, a clock as a periodic signal is employed as the memory array selection signal ASEL. In FIG. 5, a control signal NWE is input into the signal distribution circuit 51, while an address signal An is input into the signal distribution circuit 50. In the example of FIG. 5, a clock CLK serves as the memory array selection signal ASEL for the signal distribution circuits 50 and 51. Each of the signal distribution circuits 50 and 51 includes two flipflops 53 and an inverter 54. As shown in FIG. 5, the placement of the inverter 54 for the clock CLK supplied to the flipflops 53 is different between the signal distribution circuit 50 for address and the signal distribution circuit 51 for control.

In the signal distribution circuit 50 for address, the clock CLK for one of the flipflops 53 directed to the second memory array 20 is input into the flipflop 53 via the inverter 54. That is, the signal distribution circuit 50 transmits a signal to the first memory array 10 at the rising edge of the clock CLK, while transmitting a signal to the second memory array 20 at the falling edge thereof. On the contrary, in the signal distribution circuit 51 for control, the clock CLK for one of the flipflops 53 directed to the first memory array 10 is input into the flipflop 53 via the inverter 54. That is, the signal distribution circuit 51 transmits a signal to the second memory array 20 at the rising edge of the clock CLK, while transmitting a signal to the first memory array 10 at the falling edge thereof.

FIG. 6 is a timing chart of the operations described above, in which the operations of control signals NWE and NOE and the address signal An are shown. As is found from FIG. 6, at the rising of the clock CLK, the states of the control terminal 41 and the address terminal 40 are captured, and the address signal is transmitted to the first memory array 10 while the control signal is transmitted to the second memory array 20. Likewise, at the falling of the clock CLK, the states of the control terminal 41 and the address terminal 40 are captured, and the address signal is transmitted to the second memory array 20 while the control signal is transmitted to the first memory array 10.

In the example shown in FIG. 6, at timing (1), an address An-1 on the address line 60 for the first memory array 10 shifts, and at timing (2), a control signal NWE1 on the control line 63 for the first memory array 10 shifts to 'L'. The shifted states are held until the next rising and falling, respectively.

As described above, the control signal and the address signal are input independently for each of the first and second memory arrays 10 and 20 with the phase shifted by a half cycle of the clock, so that each signal can be operated independently.

Although not illustrated, the data terminal 42 performs data input/output at timing similar to that for the address terminal 40.

In this embodiment, as in Embodiment 3, the clock CLK is input, not only into the memory chip 1, but also into the CPU1 and CPU2 shown in FIG. 1. The CPU1 and CPU2 may merely transmit/receive signals to/from the memory chip 1 in synchronization with the rising and falling timing of the clock CLK. No arbitration is therefore necessary between the CPU 1 and CPU2 on the access to the memory chip 1.

In general, a flash memory captures the address signal and the data signal at the shift points of the control signal. The CPU therefore must transmit the address signal and the data signal to match with the shift timing of the control signal. In this embodiment, the control signal and the address signal/data signal are input with the phase shifted by a half cycle of the clock CLK for each of the memory arrays 10 and 20. Therefore, the timing design of memory access can be facilitated.

As described above, in this embodiment, by shifting the control signal and the address signal/data signal by a half cycle of the clock CLK, the timing design of capture of commands and addresses on the side of the memory chip 1 and capture of data on the side of the information processing devices is more facilitated than in Embodiment 3.

Embodiment 5

Figure 7:
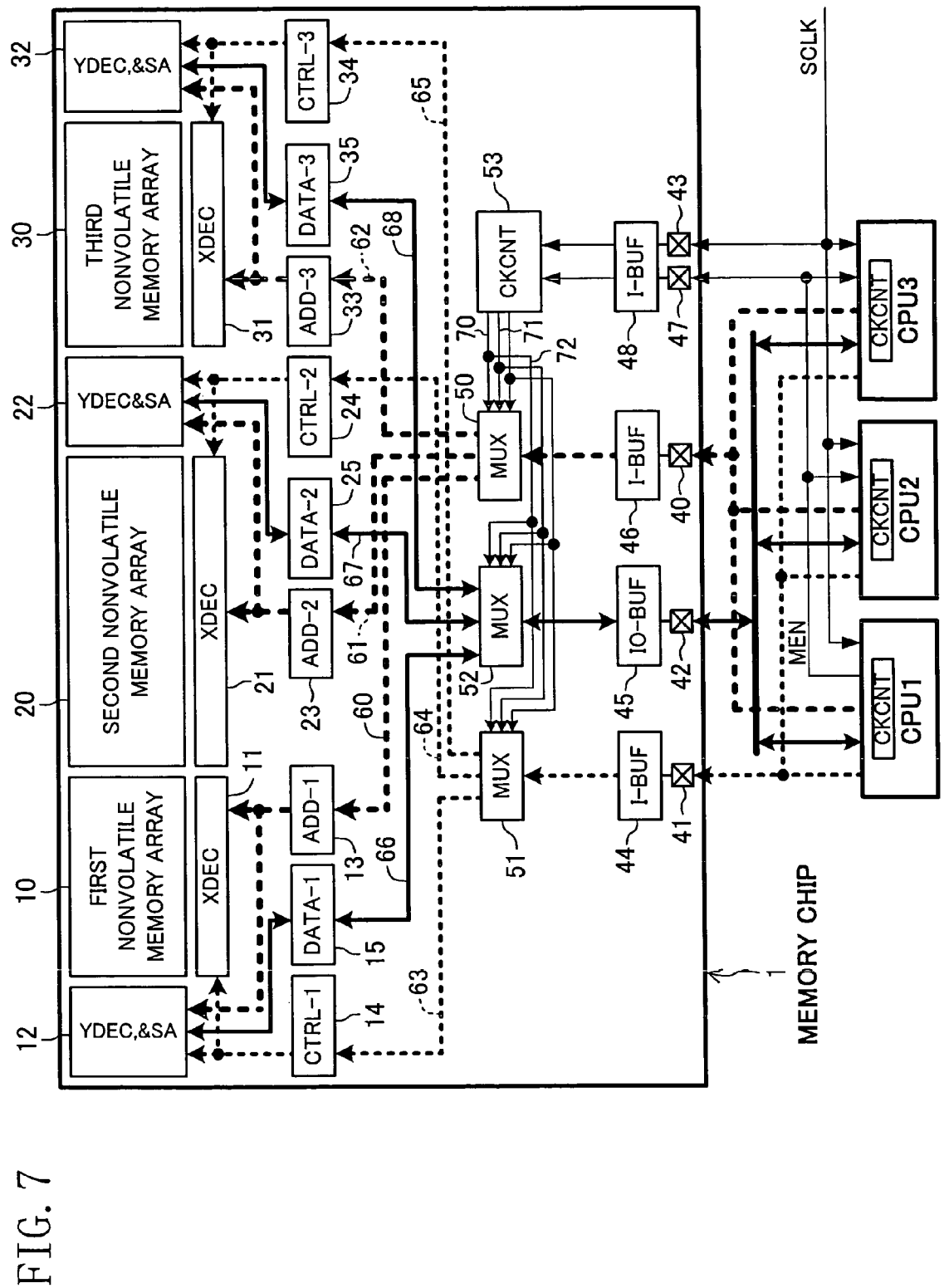
FIG. 7 is a block diagram of a semiconductor memory device of Embodiment 5.
Figure 8:
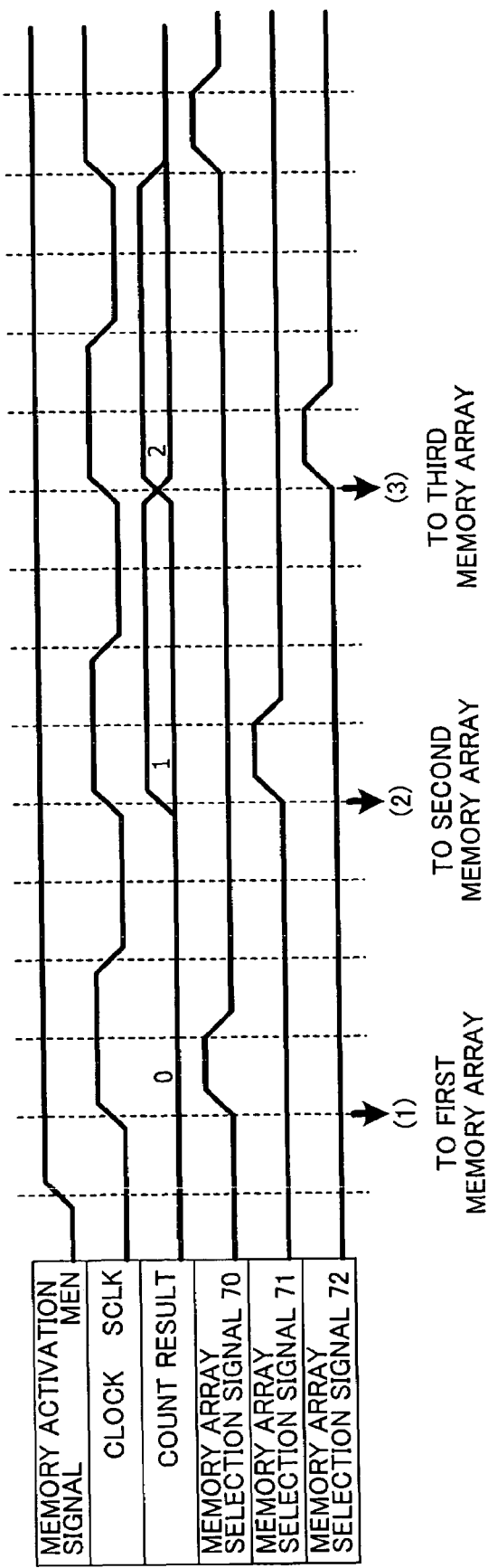
FIG. 8 is an operation sequence diagram of the semiconductor memory device of Embodiment 5.

FIG. 7 is a block diagram of a semiconductor memory device of Embodiment 5 of the present invention, and FIG. 8 is a timing chart of the operation of this device.

The semiconductor memory device of FIG. 7 has three CPUs, CPU1, CPU2 and CPU3 (information processing devices) placed externally. Within a memory chip 1, three nonvolatile memory arrays 10, 20 and 30 are provided. For each of the memory arrays 10, 20 and 30, provided are a row decoder XDEC 11, 21, 31 for selecting a word line and a sense amplifier/column decoder YDEC&SA 12, 22, 33 for selecting a bit line and amplifying data. Also, for the memory array 10, provided are an address-related circuit ADD-1 13, a control-related circuit CTRL-1 14 and a data-related circuit DATA-1 15. For the memory array 20, provided are an address-related circuit ADD-2 23, a control-related circuit CTRL-2 24 and a data-related circuit DATA-2 25, and for the memory array 30, provided are an address-related circuit ADD-3 33, a control-related circuit CTRL-3 34 and a data-related circuit DATA-3 35.

As in Embodiment 1, a single-route address terminal 40, control terminal 41 and data terminal 42 are placed in an interface portion of the memory chip 1 interfacing the outside of the chip, from which terminals lines extend up to signal distribution circuits MUX 50, 51 and 52 via input buffers IBUF 46 and 44 and an I/O buffer IOBUF 45.

In this embodiment, a clock as a periodic signal is employed as the memory array selection signal ASEL. A clock SCLK is input into the memory chip 1 at a terminal 43 as the memory array selection signal ASEL, as well as into the CPU1 to CPU3.

Also, a memory activation signal MEN is output from the CPU1 to be input into the memory chip 1 at a terminal 47, as well as into the other two CPUs, CPU2 and CPU3.

The clock SCLK and the memory activation signal MEN are supplied to a count circuit CKCNT 53 via an input buffer 48 of the memory chip 1. The count circuit CKCNT 53 counts the clock SCLK, and after counting, outputs memory array selection signals 70, 71 and 72 to the signal distribution circuits 50, 51 and 52.

From the three signal distribution circuits MUX, signal line groups 60 to 68 for the three memory arrays 10, 20 and 30 extend to be connected to the address-related circuits 13, 23 and 33, the control-related circuits 14, 24 and 34, and the data-related circuits 15, 25 and 35, respectively.

Signal line groups from the CPU1, CPU2 and CPU3 for the memory chip 1 are shared as illustrated, and connected to the terminals 40, 41 and 42 of the memory chip 1. The memory array selection signal ASEL (clock SCLK) is input, not only into the memory chip 1, but also into the CPU1 to CPU3.

Hereinafter, signal transmission/reception between the CPU1, CPU2, CPU3 and the memory array 10, 20, 30 will be described with reference to FIG. 8.

The memory activation signal MEN is transmitted from the CPU1 (shifts from 'L' to 'H'), to allow the count circuit CKCNT 53 in the memory chip 1 to start counting in synchronization with the clock SCLK input into the memory chip 1. The result of this counting is shown in FIG. 8 as "count result". In the illustrated example, the counting is made from 0 to 2. Based on the count result, a pulse is given in the memory array selection signal 70 at timing (1), in the memory array selection signal 71 at timing (2) and in the memory array selection signal 72 at timing (3) as shown in FIG. 8. These pulses are transmitted to the signal distribution circuits 50, 51 and 52, to allow an address-related signal, a control-related signal and a data-related signal to be supplied to the memory arrays 10, 20 and 30.

Similar count circuits CKCNT are also placed in the CPU1 to CPU3, which count the clock SCLK after the activation of the memory activation signal MEN, to allow the CPU1 to CPU3 to access the memory chip 1. In other words, only the clock count number is used for arbitration on which CPU should access which array, and this alleviates the burden related to handling of the memory management among the three CPUs, CPU1 to CPU3.

By configuring as described above, signal transmission/reception can be made between the CPU1, CPU2, CPU3 and the memory array 10, 20, 30 depending on the count number of the clock SCLK. Moreover, with the provision of the signal distribution circuits 50, 51 and 52, while one memory array is being selected, no signal is transmitted to any other memory array. Furthermore, with the address-related circuit, the control-related circuit and the data-related circuit individually provided for each memory array, commands from the CPU1, CPU2 and CPU3 can be decrypted separately. Thus, data can be read from one memory array while write data is being input, for example.

Note that, while Embodiments 1 to 4 described above supported only two memory arrays, this embodiment is applicable to existence of three or more memory arrays and information processing devices.

Although the case of three memory arrays was shown in FIG. 7, it is needless to mention that this embodiment can also support cases of more than three memory arrays.

As described above, this embodiment, which permits selection of three or more memory arrays, is useful for more complicated memory systems.

Embodiment 6

Figure 9:
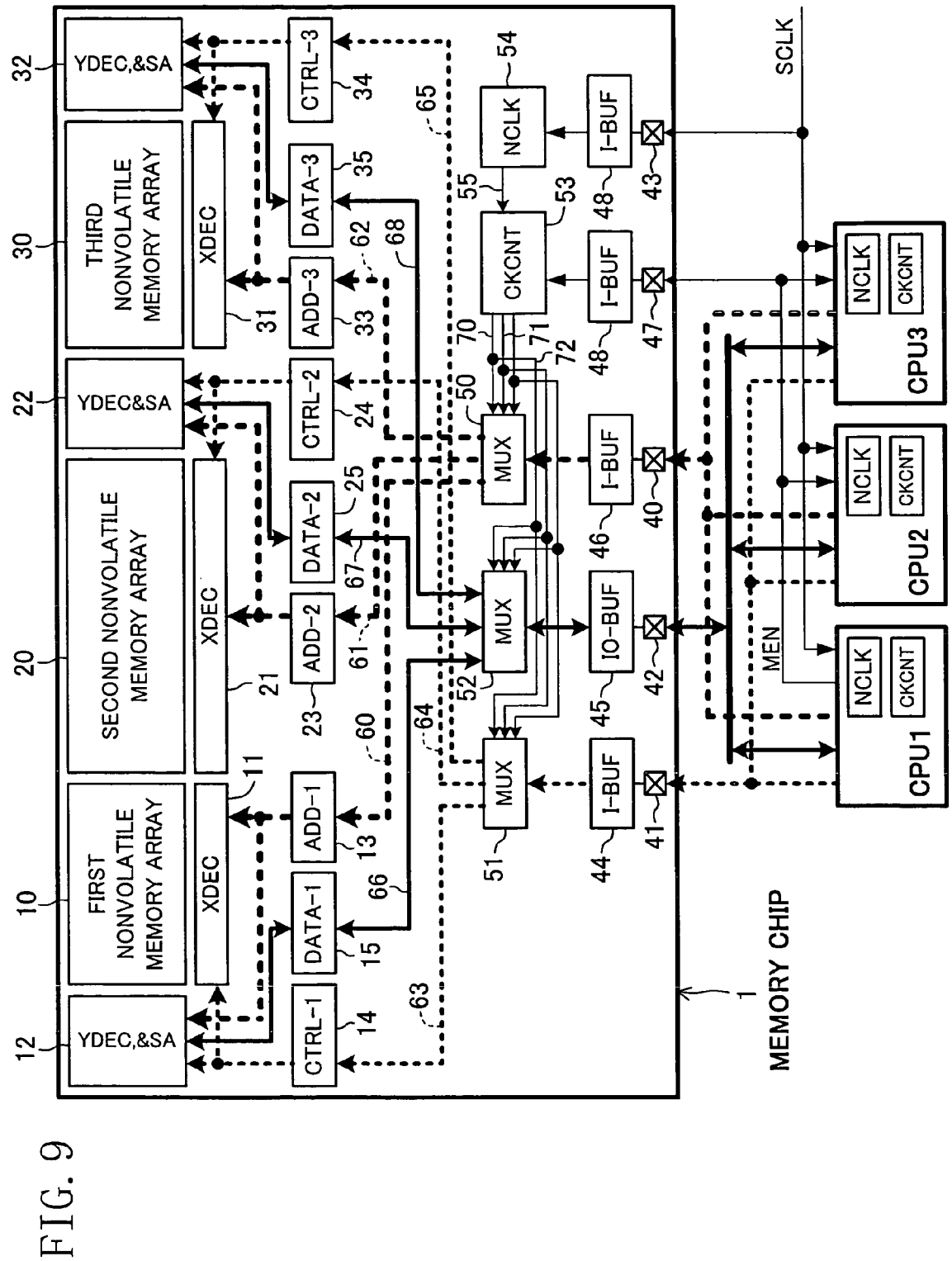
FIG. 9 is a block diagram of a semiconductor memory device of Embodiment 6.
Figure 10:
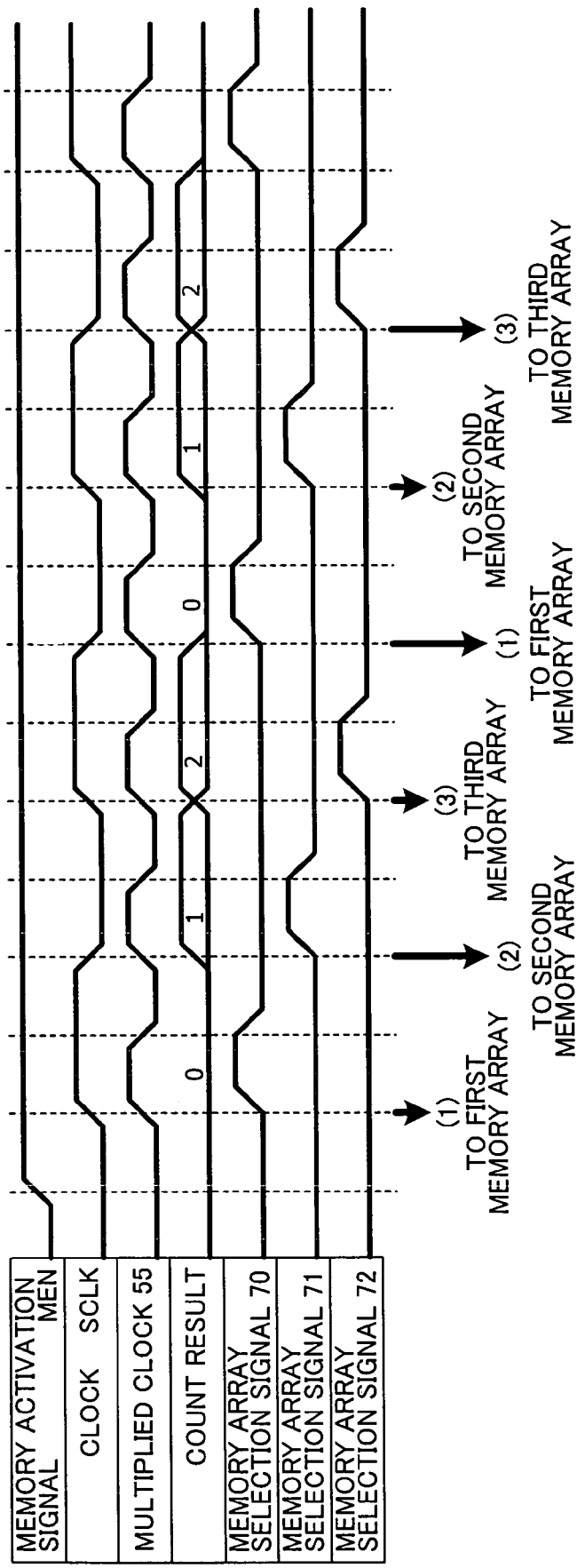
FIG. 10 is an operation sequence diagram of the semiconductor memory device of Embodiment 6.

FIG. 9 is a block diagram of a semiconductor memory device of Embodiment 6 of the present invention, and FIG. 10 is a timing chart of the operation of this device.

The semiconductor memory device shown in FIG. 9 is similar to the device of Embodiment 5 shown in FIG. 7 in many portions, and thus only different portions are described in this embodiment.

In this embodiment, a clock multiplication circuit NCLK 54 is provided in the memory chip 1. The clock SCLK is not input into the count circuit 53 directly, but is first input into the clock multiplication circuit NCLK 54 to multiply the frequency of the clock SCLK. A multiplied clock 55 is then transmitted to the count circuit CKCNT 53. The subsequent operation of the count circuit 53 is as described above in Embodiment 5, in which the multiplied clock 55 is counted after input of the memory activation signal MEN to generate the memory array selection signals 70, 71 and 72.

In this embodiment, the count circuit CKCNT and the clock multiplication circuit NCLK are provided, not only in the memory chip 1, but also in the CPU1 to CPU3.

The timing chart of FIG. 10 is roughly the same as that of FIG. 8 in Embodiment 5. The difference is that the multiplication clock 55 is generated and the memory array selection signals 70 to 72 are generated based on this clock. The timing of signal allocation to the first to third memory arrays 10 to 30 is as shown in FIG. 10. Although the clock SCLK is doubled in the example shown in FIG. 10, the clock multiplication of the present invention is not limited to doubling.

In this embodiment, since the clock SCLK is multiplied before being input, transmission/reception between the information processing devices and the memory arrays can be performed frequently, compared with Embodiment 5.

As described above, in this embodiment, selection of three or more memory arrays is permitted, and also memory access can be made more frequently than in Embodiment 5. This embodiment is therefore useful for more complicated memory systems.

Embodiment 7

Figure 11:
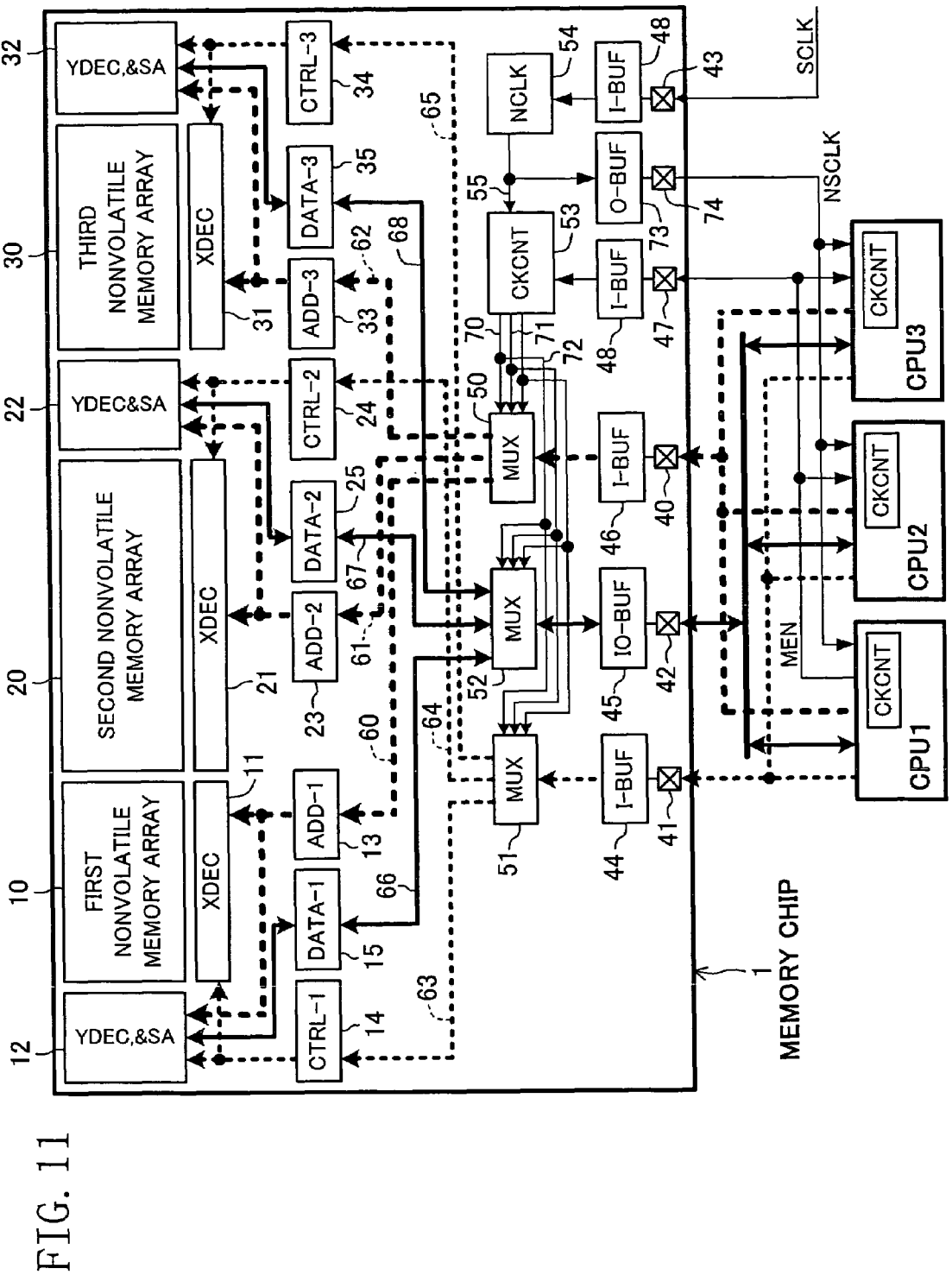
FIG. 11 is a block diagram of a semiconductor memory device of Embodiment 7.

FIG. 11 is a block diagram of a semiconductor memory device of Embodiment 7 of the present invention.

The semiconductor memory device shown in FIG. 11 is similar to the devices of Embodiments 5 and 6 shown in FIGS. 7 and 9 in many portions, and thus only different portions are described in this embodiment.

In this embodiment, the clock multiplication circuit NCLK 54 is provided only in the memory chip 1. It is unnecessary to provide the clock multiplication circuit NCLK 54 in the CPU1 to CPU3, which are therefore provided with only the count circuit.

In the memory chip 1, the clock SCLK is input into the clock multiplication circuit 54 to multiply the frequency of the clock SCLK. The resultant multiplied clock 55 is transmitted to the count circuit 53. Simultaneously, the multiplied clock NSCLK is transmitted outside the memory chip 1 via an output buffer OBUF 73 and a multiplied clock terminal 74 to be input into the CPU1 to CPU3.

The operation of the memory chip 1 is as shown in the timing chart of FIG. 10. In the CPU1 to CPU3, the multiplied clock NSCLK received from the memory chip 1 is counted with the count circuit CKCNT incorporated therein, for execution of transmission/reception to/from the memory arrays 1 to 3.

The operation of the count circuit 53 is as described above in Embodiment 5, in which the multiplied clock 55 is counted after input of the memory activation signal MEN to generate the memory array selection signals 70, 71 and 72.

In this embodiment, since the clock SCLK is multiplied before being input, transmission/reception between the information processing devices and the memory arrays can be performed frequently, compared with Embodiment 5. Also, since no clock multiplication circuit is necessary in the CPUs, the area of the information processing devices outside the memory chip 1 can be reduced, compared with Embodiment 6.

As described above, in this embodiment, selection of three or more memory arrays is permitted, and also memory access can be made more frequently than in Embodiment 5. In addition, the burden on the information processing devices for providing an additional circuit for memory access can be alleviated, compared with Embodiment 6. Thus, this embodiment is useful for more complicated memory systems.

Embodiment 8

Figure 12:
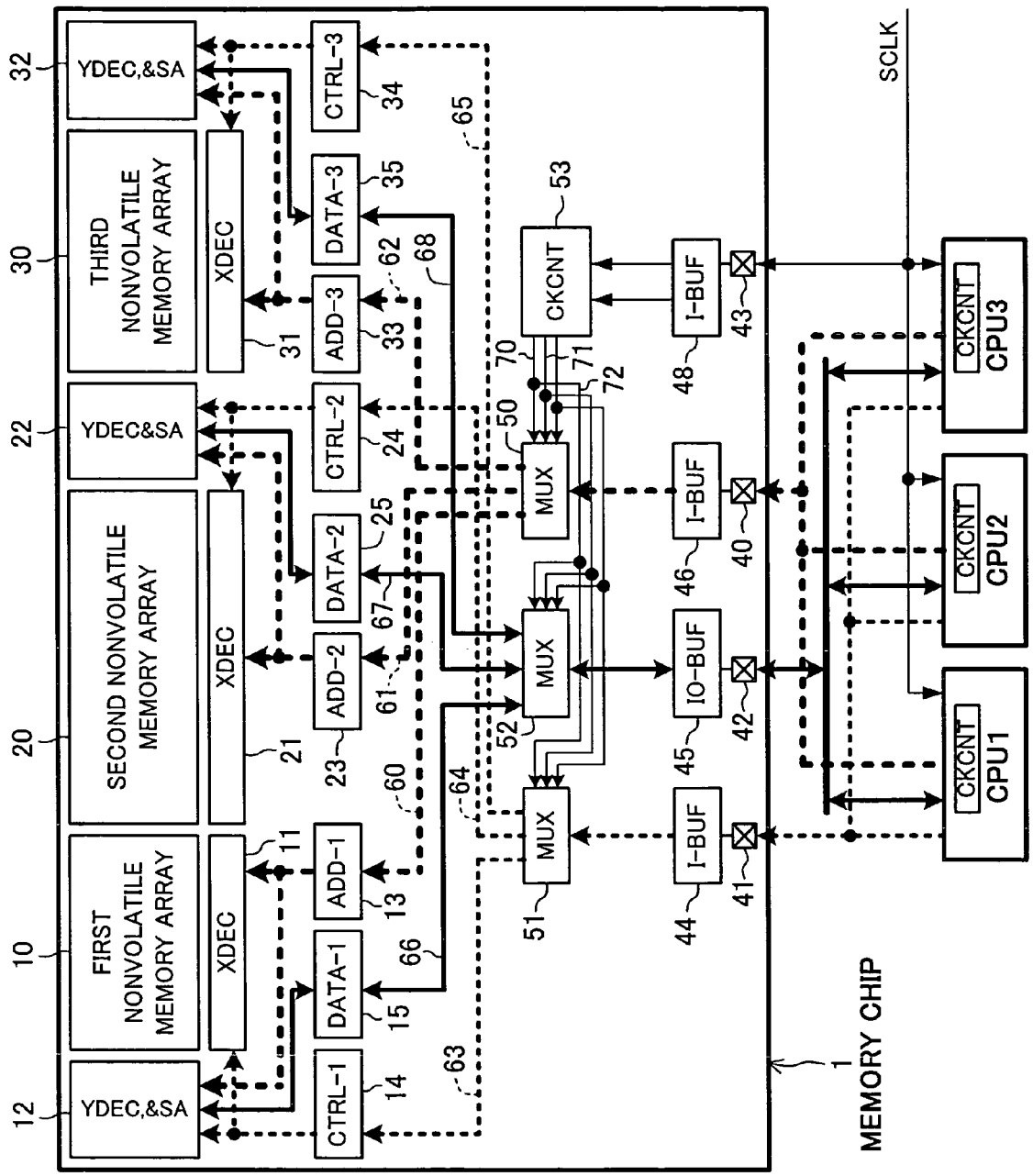
FIG. 12 is a block diagram of a semiconductor memory device of Embodiment 8.
Figure 13:
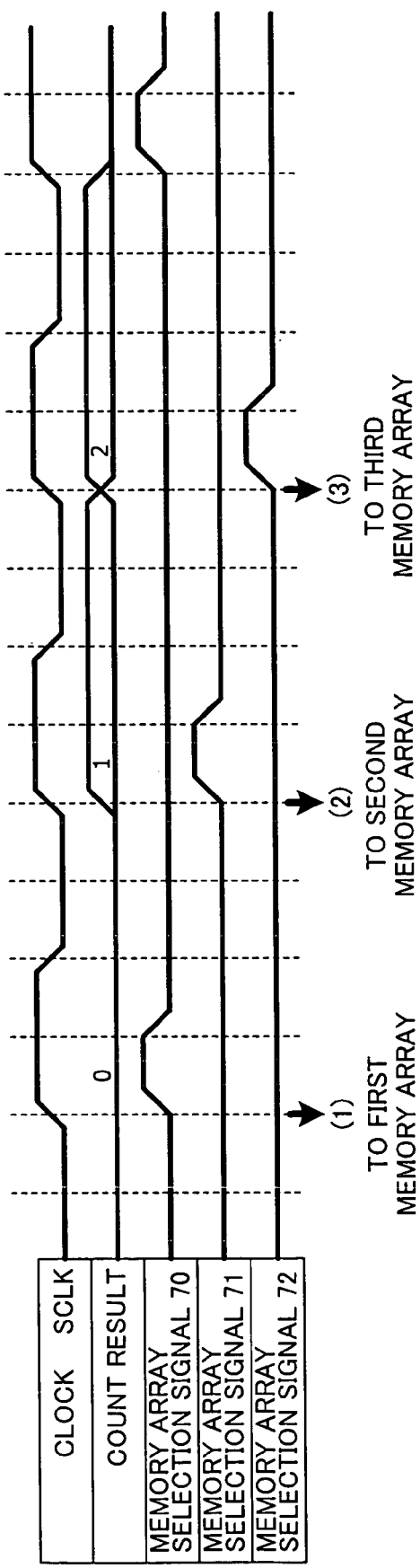
FIG. 13 is an operation sequence diagram of the semiconductor memory device of Embodiment 8.

FIG. 12 is a block diagram of a semiconductor memory device of Embodiment 8 of the present invention, and FIG. 13 is a timing chart of the operation of this device.

The semiconductor memory device shown in FIG. 12 is similar to the device of Embodiment 5 shown in FIG. 7 in many portions, and thus only different portions are described in this embodiment.

In this embodiment, the memory activation signal MEN generated in the CPU1 is omitted. The memory activation signal MEN is neither necessary in the memory chip 1 nor in the CPU1 to CPU3. The count circuit CKCNT 53 starts counting at the time point of input of the clock SCLK, to generate the memory array selection signals 70 to 72.

The timing chart of FIG. 13 is roughly the same as that of FIG. 8 in Embodiment 5. The difference is that the memory activation signal MEN is omitted. As described above, the count circuit 53 starts counting at the time point of input of the clock SCLK, to generate the memory array selection signals 70 to 72. The timing of signal allocation to the first to third memory arrays 10 to 30 is as shown in FIG. 10. Although the clock has been multiplied by two in the example of FIG. 10, the clock multiplication is not limited to doubling.

In this embodiment, since the memory array activation signal MEN is unnecessary, compared with Embodiment 5, the number of pins in the memory chip 1 can be reduced.

Although not shown, the feature of this embodiment is also applicable to Embodiments 6 and 7 described above.

As described above, in this embodiment, in which the memory activation signal MEN is omitted, the number of pins can be reduced compared with Embodiments 5, 6 and 7.

Embodiment 9

Figure 14:
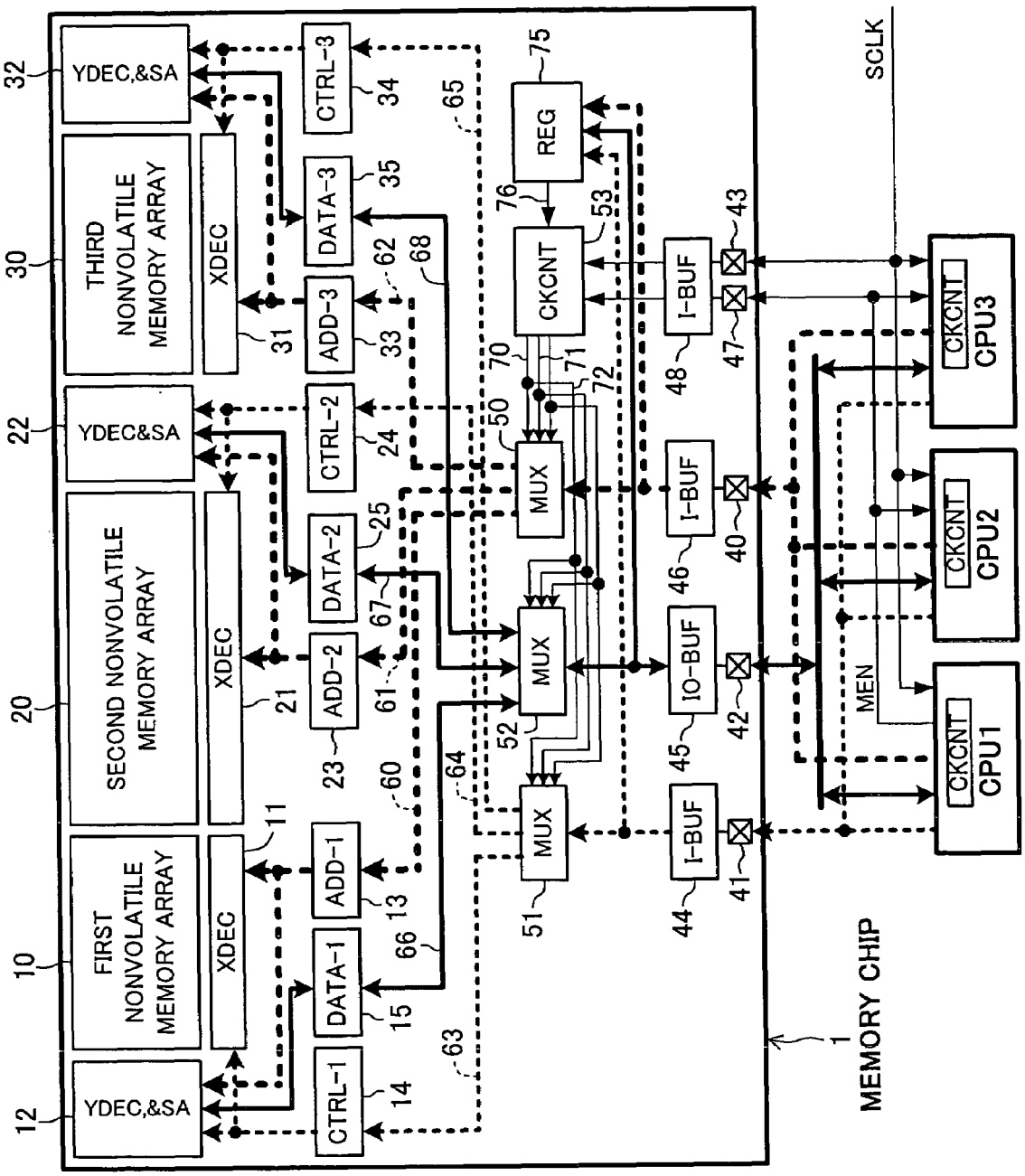
FIG. 14 is a block diagram of a semiconductor memory device of Embodiment 9.

FIG. 14 is a block diagram of a semiconductor memory device of Embodiment 9 of the present invention.

The semiconductor memory device shown in FIG. 14 is similar to the device of Embodiment 5 shown in FIG. 7 in many portions, and thus only different portions are described in this embodiment.

The difference is that a status setting circuit REG 75 is provided in the memory chip 1 in this embodiment. The address terminal 40, the control terminal 41 and the data terminal 42 are connected to the status setting circuit REG 75 via the input/output buffers 44 to 46. A status signal 76 from the status setting circuit REG 75 is output to the count circuit CKCNT 53. The function of the status setting circuit 75 is to determine the relationship between the count number in the count circuit CKCNT 53 and the memory array selection signals 70 to 72.

To state more specifically, the address signal, the control signal and the data signal are supplied to the memory chip 1 from outside, and with these signals the status setting circuit REG 75 changes the way of selection of the memory arrays. This will be described with reference to the timing chart of FIGS. 15A and 15B. In FIG. 15A, control is made so that the signals are allocated to the first memory array 10 if the count result is '0', to the second memory array 20 if it is '1', and to the third memory array 30 if it is '2'. In FIG. 15B, control is made so that the signals are allocated to the third memory array 30 if the count result is '0', to the first memory array 10 if it is '1', and to the second memory array 20 if it is '2'. The above control can be realized by changing the control of the count circuit CKCNT with the status setting circuit 75.

Although not shown, the feature of this embodiment is also applicable to Embodiments 6, 7 and 8 described above.

In this embodiment, unlike Embodiments 5, 6, 7 and 8 described above, the address signal, the control signal and the data signal are input into the status setting circuit 75 from outside, and with these signals, the relationship between the count number in the count circuit CKCNT 53 and the memory array selection signals 70 to 72 can be changed. Thus, the order of access to the memory arrays 10 to 30 can be changed, and this makes it possible to access the memory arrays in a desired order depending on the operation mode.

Embodiment 10

Figure 16:
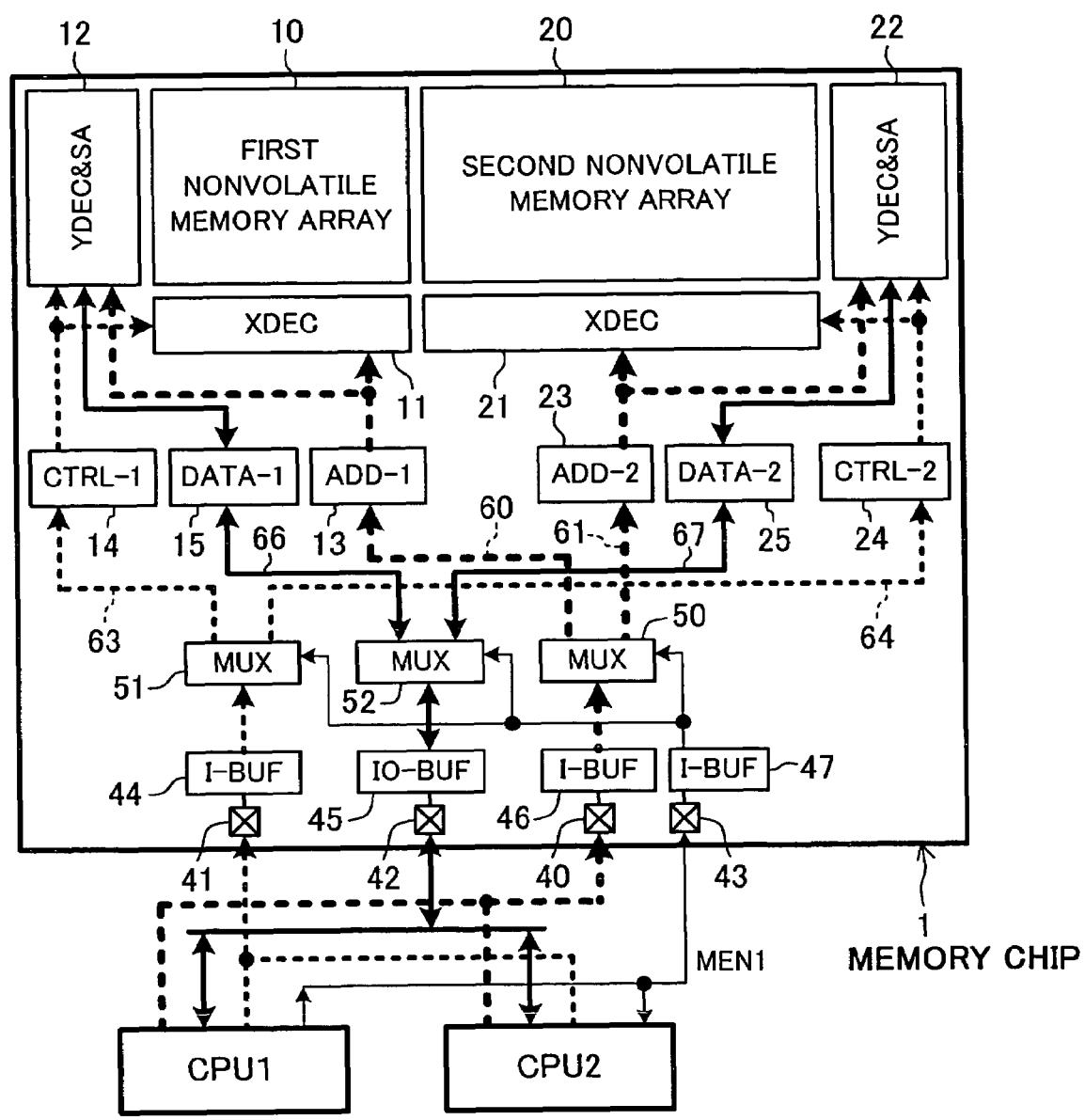
FIG. 16 is a block diagram of a semiconductor memory device of Embodiment 10.

FIG. 16 is a block diagram of a semiconductor memory device of Embodiment 10 of the present invention.

The semiconductor memory device shown in FIG. 16 is similar to the device of Embodiment 1 shown in FIG. 1 in many portions, and thus only different portions are described in this embodiment.

In this embodiment, a memory array activation signal MEN1 generated from the CPU1 is used as the memory array selection signal ASEL. This signal is supplied, not only to the memory chip 1, but also to the CPU2.

In this embodiment, the signal distribution circuits 50 to 52 are controlled according to the state of the memory array activation signal MEN1. For example, signals may be transmitted to the first memory array 10 if MEN1='H' (or 'L') and to the second memory array 20 if MEN1='L' (or 'H'). By setting in this way, signal transmission/reception between the CPU1, CPU2 and the first and second memory arrays 10 and 20 can be made. Also, it is ensured that no access to a memory array is allowed from the CPU2 during the period when the memory array activation signal MEN1 from the CPU1 is being activated. Thus, the memory array activation signal MEN1 serves both for allocation of the memory arrays and arbitration between the CPU1 and CPU2.

Although selection of a memory array is made with 'H' or 'L' of MEN1 in this example, the rising (falling) timing may be used to capture a signal as in Embodiments 3 and 4.

In the case of selecting a memory array with a clock as in Embodiments 3 to 9, memory access is allowed only during a period of the clock cycle. By selecting a memory array without use of a clock as in this embodiment, a memory array can be accessed during any given desired period. Therefore, when access to one memory is no more necessary, access to the other memory can be made in concentration. Thus, efficient memory use is attained.

As described above, in this embodiment, the time period of selection of a memory array can be arbitrarily determined, not determined with the clock cycle. Efficient memory use is therefore attained.

Embodiment 11

Figure 17:
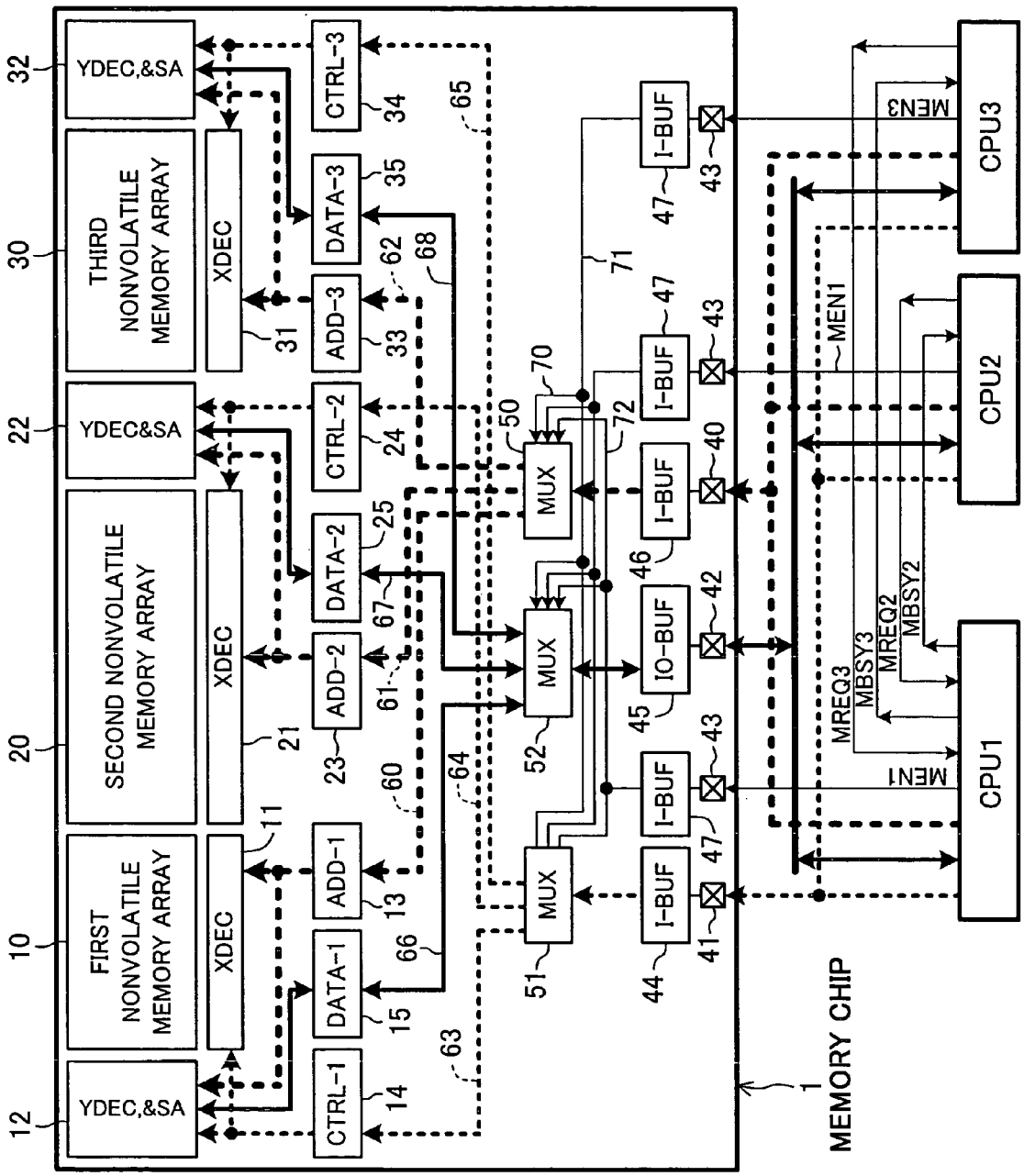
FIG. 17 is a block diagram of a semiconductor memory device of Embodiment 11.

FIG. 17 is a block diagram of a semiconductor memory device of Embodiment 1 of the present invention.

The semiconductor memory device shown in FIG. 17 is similar to the device of Embodiment 10 shown in FIG. 16 in many portions, and thus only different portions are described in this embodiment.

While two memory arrays are provided in Embodiment 10, three memory arrays are provided in this embodiment. Memory activation signals MEN1 to MEN3 are generated from the CPU1 to CPU3, input into three terminals 43 of the memory chip 1, and then supplied to the signal distribution circuits 50 to 52 via three input buffers 47, to be distributed to the first to third memory arrays 10 to 30. As in Embodiment 10, the 'H' (or 'L') period or the rising (falling) timing of the memory activation signals MEN1 to MEN3 can be used for the signal distribution.

In this embodiment, in which two or more memory array activation signals MEN1 to MEN3 are provided, arbitration among CPU1 to CPU3 is necessary. Memory access request signals MREQ2 and MREQ3 are transmitted from the CPU2 and CPU3 to the CPU1. In response to these, the CPU1 determines whether or not any CPU is accessing the memory chip 1 and transmits memory busy signals MBSY2 and MBSY3 to the CPU2 and CPU3. If the memory busy signal MBSY2 is active, the CPU2 is not allowed to access the memory chip 1. Likewise, if the memory busy signal MBSY3 is active, the CPU3 is not allowed to access the memory chip 1. In this embodiment, high priority is given to the CPU1 in accessing the memory chip 1. The CPU1 will interrupt memory access from the CPU2 or CPU3, if any, when intending to access the memory chip 1. In such an occasion, the CPU1 transmits the memory busy signal MBSY2 or MBSY3 to the CPU2 or CPU3 to terminate the memory access, to thereby enable interrupting access from the CPU1.

As described above, in the case of selecting a memory array with a clock as in Embodiments 3 to 9, memory access is allowed only during a time period according to the clock cycle. By selecting a memory array without use of a clock as in this embodiment, a memory array can be accessed during any given desired period. Therefore, when access to one memory is no more necessary, access to another memory can be made in concentration. Thus, efficient memory use is attained.

In this embodiment, the time period of selection of a memory array can be arbitrarily determined, not determined with the clock cycle as in Embodiments 3 to 9. Efficient memory use is therefore attained. Moreover, while only two memory arrays can be selected in Embodiment 10, more than two memory arrays can be selected in this embodiment. This embodiment is therefore useful for systems having a plurality of memory arrays and information processing devices.

Embodiment 12

Figure 18:
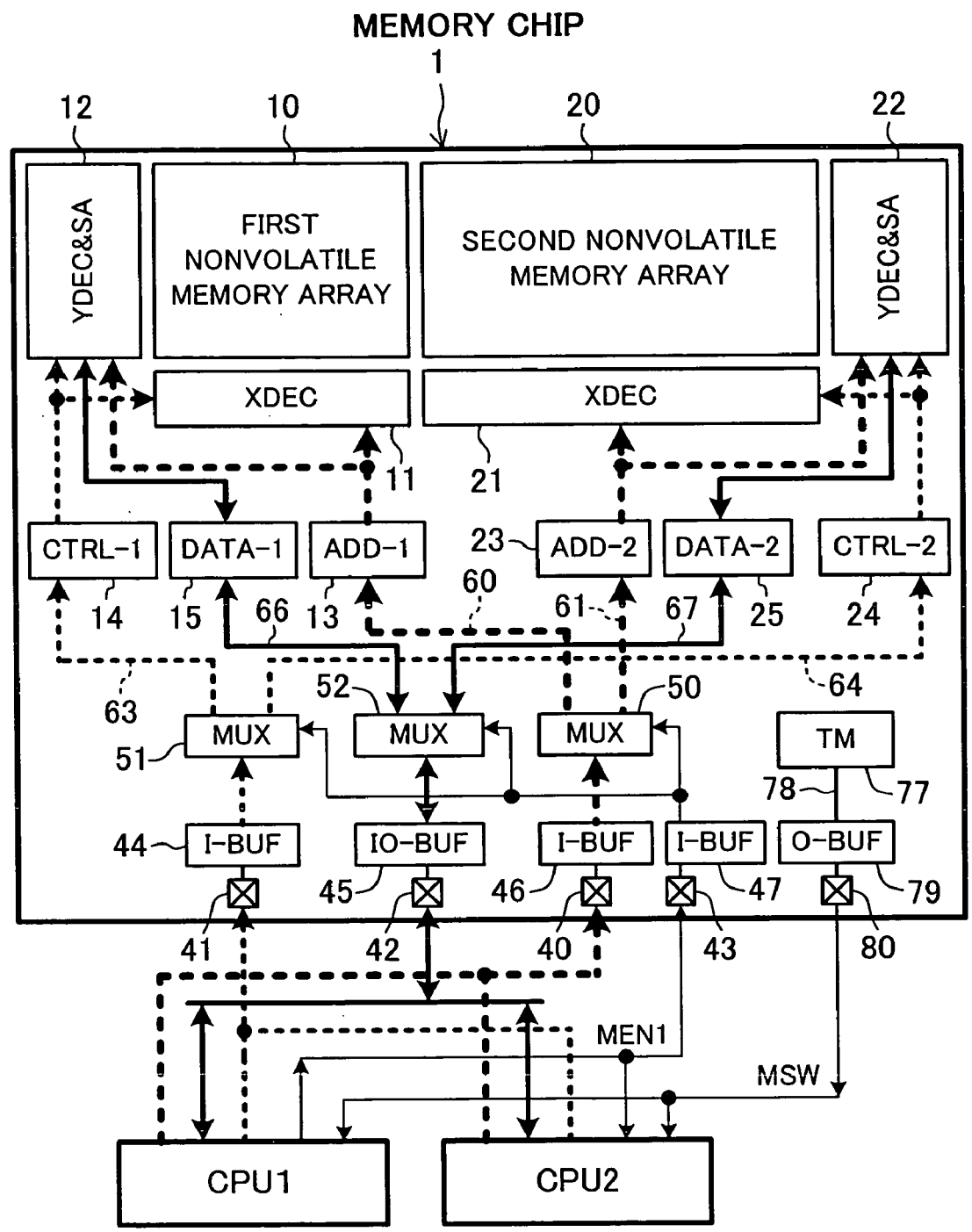
FIG. 18 is a block diagram of a semiconductor memory device of Embodiment 12.
Figure 19:
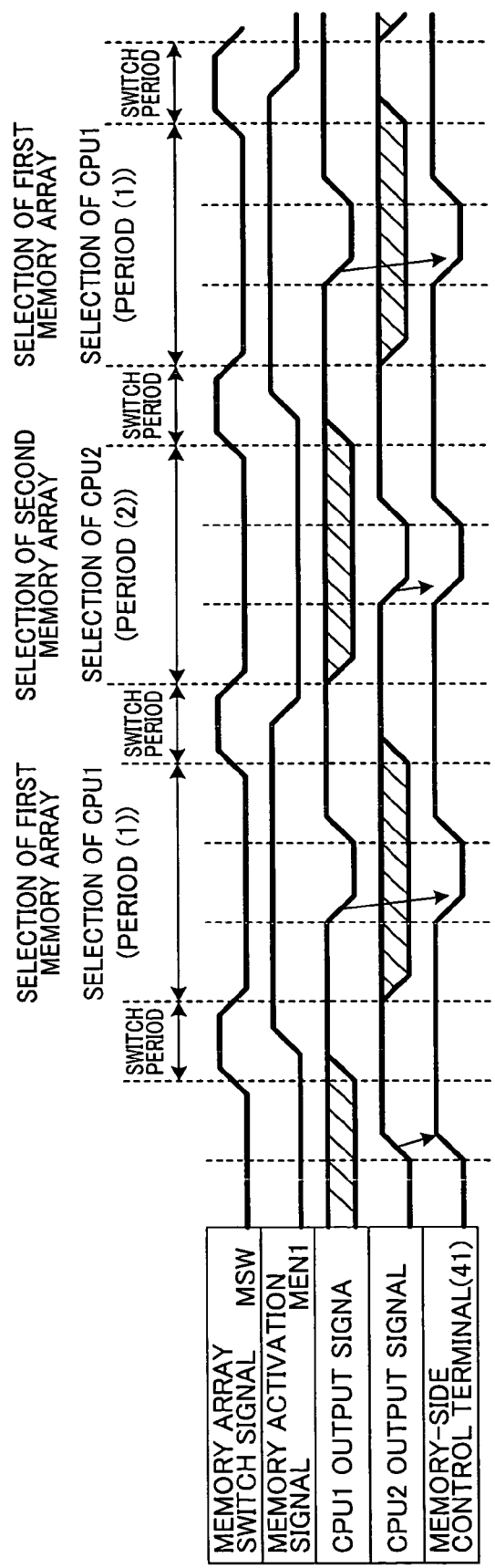
FIG. 19 is an operation sequence diagram of the semiconductor memory device of Embodiment 12.

FIG. 18 is a block diagram of a semiconductor memory device of Embodiment 12 of the present invention. FIG. 19 is a timing chart of the operation of this device.

In Embodiments 10 and 11, when the address, control and other signals issued from the CPU1 and CPU2 are united outside the chip, consideration must be made so that 'H' output and 'L' output do not coincide with each other in each signal. Also, when the data terminal 42 is switched from output to input, such a situation that the CPU 1 is in 'H' output (or 'L' output) while the memory chip 1 is in 'L' output (or 'H' output) may possibly occur. In this situation, also, a through current may flow between the memory chip 1 and the CPU, causing the possibility of occurrence of a malfunction. This embodiment deals with such problems.

The semiconductor memory device shown in FIG. 18 is similar to the device of Embodiment 10 shown in FIG. 16 in many portions, and thus only different portions are described in this embodiment.

The difference is that in this embodiment a timer circuit TM 77 is provided in the memory chip 1 and the output thereof is output externally via an output buffer 79 and a terminal 80 as a memory array switch signal MSW, which is supplied to the CPU1 and CPU2.

The operation will be described with reference to FIG. 19. The timer circuit 77 generates a pulse signal 78 of a fixed width in a fixed cycle, which signal is supplied to the CPU1 and CPU2 as the memory array switch signal MSW. The CPU1 shifts the state of the memory activation signal MEN1 when the memory array switch signal MSW is 'H'.

During the switch period in which the memory array switch signal MSW is 'H', the output signals from the CPU1 and CPU2 to the memory chip 1 are both kept 'H' or 'L' to ensure that these outputs do not collide with each other. If the memory activation signal MEN1 is 'H', the first memory array 10 is selected, transmitting the signal from the CPU1 to the memory chip 1 (period (1)). If the memory activation signal MEN1 is 'L', the second memory array 20 is selected, transmitting the signal from the CPU2 to the memory chip 1 (period (2)). The output signal from the CPU1 to the memory chip 1 is in a desired level in the period (1) while being put in a high impedance state in the period (2). The output signal from the CPU2 to the memory chip 1 is in a high impedance state in the period (1) while being put in a desired level in the period (2). As a result, at the control terminal 41 of the memory chip 1, an 'L' pulse is given in the period (1) and another "L" pulse is given in the period (2) as shown in FIG. 19, avoiding occurrence of a collision between the outputs from the CPU1 and CPU2.

As described above, this embodiment has an effect of preventing a malfunction such as occurrence of a power supply through current due to a collision between output signals from information processing devices at the time of switching of one memory array to another.

Embodiment 13

Figure 20:
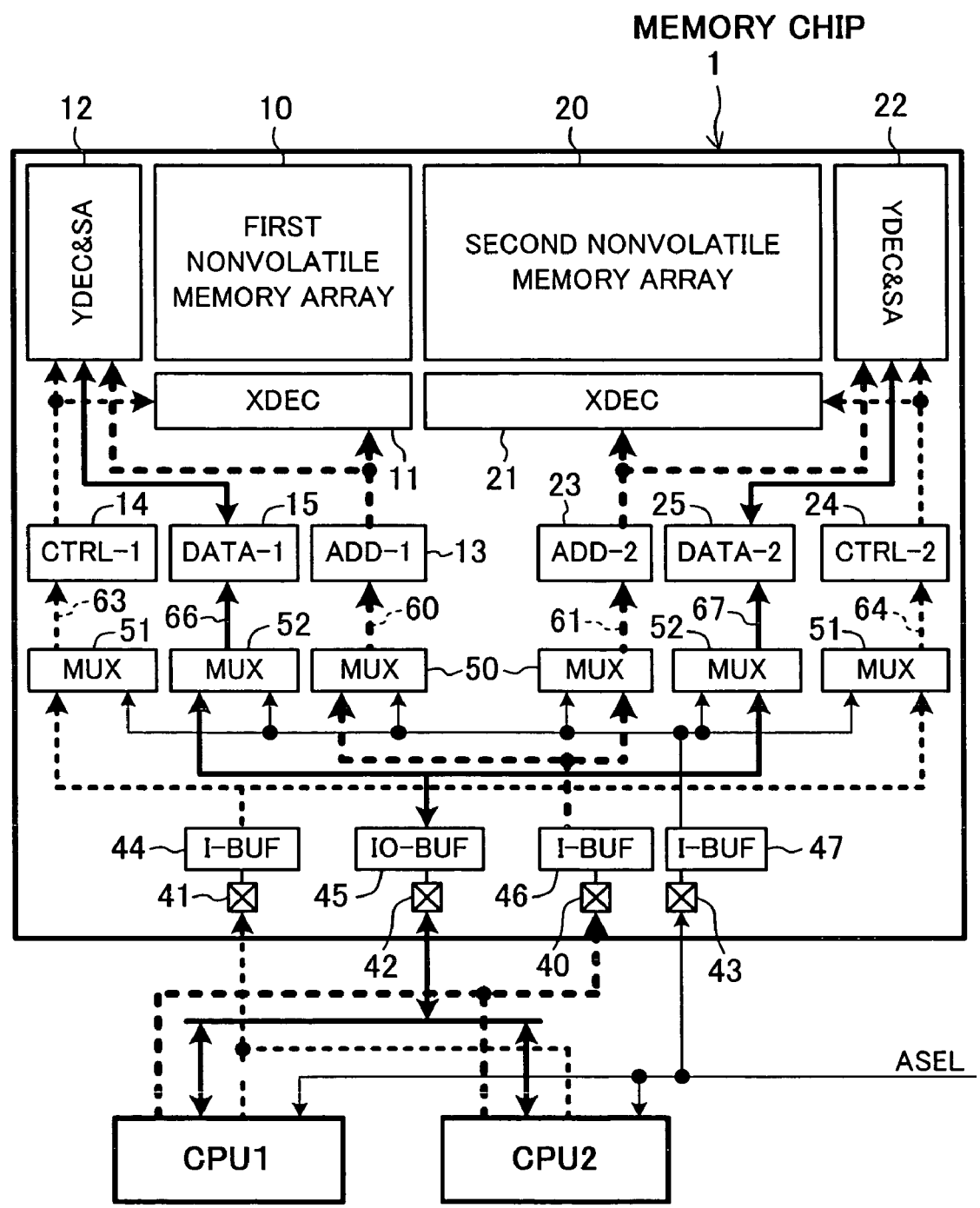
FIG. 20 is a block diagram of a semiconductor memory device of Embodiment 13.
Figure 21:
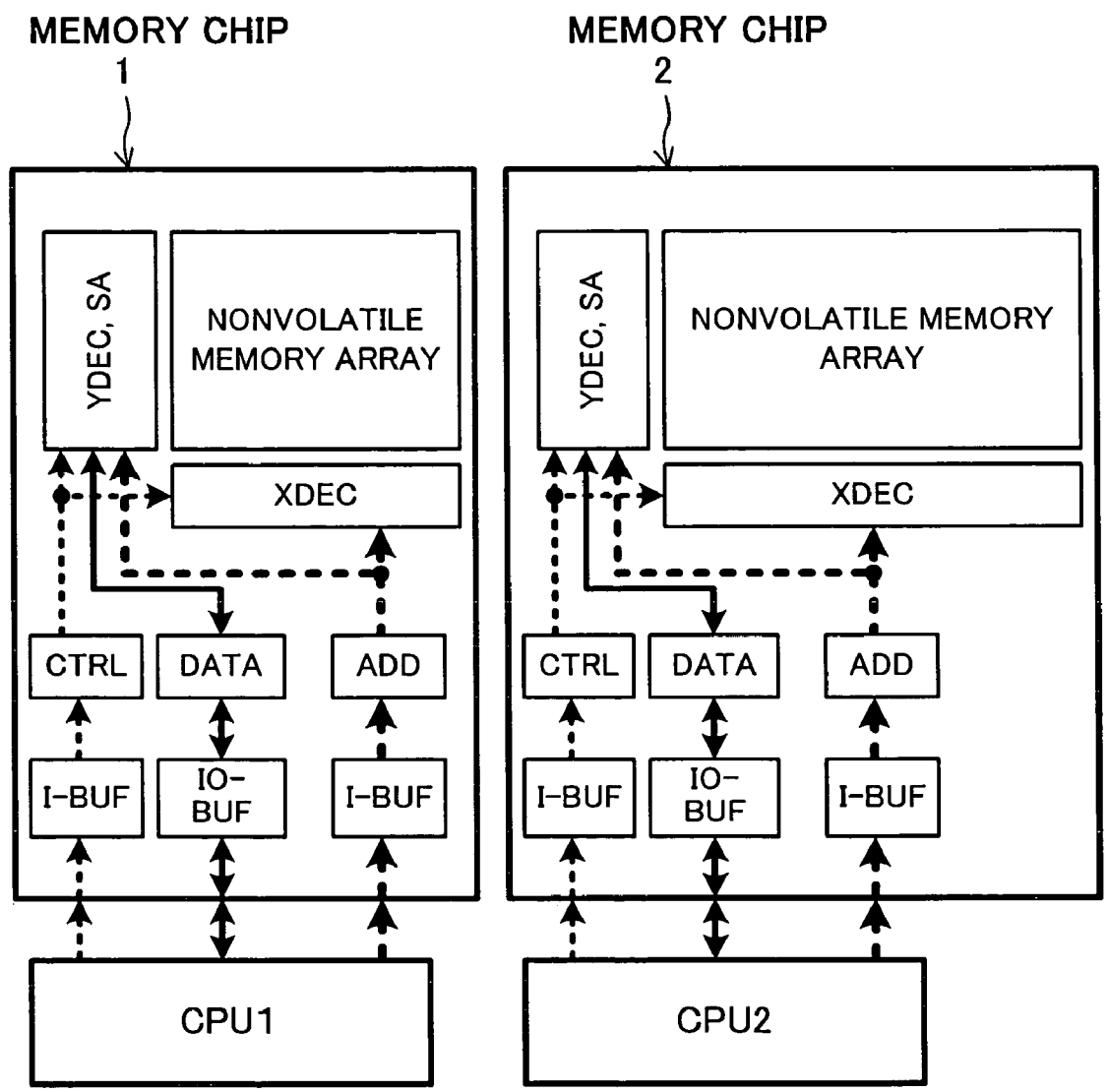
FIG. 21 is a block diagram of a conventional semiconductor memory device.

FIG. 20 is a block diagram of a semiconductor memory device of Embodiment 13 of the present invention.

The semiconductor memory device shown in FIG. 20 is similar to the device of Embodiment 1 shown in FIG. 1 in many portions, and thus only different portions are described in this embodiment.

As described in Embodiment 1, according to the present invention, a plurality of memory arrays 10 and 20 are provided in the memory chip 1, and each memory array 10, 20 is provided with its dedicated address-related circuit 13, 23, control-related circuit 14, 24 and data-related circuit 15, 25, to enable independent operation in each memory array. With this configuration, it is necessary to provide the address-related lines 60, 61, the control-related lines 63, 64 and the data-related lines 66, 67 each as many as the number of memory arrays (two in the example in FIG. 1), and this increases the size of the chip layout. In view of this problem, in this embodiment, the signal distribution circuits 50, 51 and 52 are placed near each of the memory arrays 10 and 20.

As shown in FIG. 20, the signal distribution circuits 50, 51 and 52 are placed, not in the vicinity of the input/output buffers 44, 45 and 46 at the chip external interface, but at positions near each of the first and second memory arrays. In the case of FIG. 20, the number of signal distribution circuits MUX appears doubled compared with the case of FIG. 1. Actually, however, circuit components (for example, the flip-flops 53 in FIG. 3) for allocating a signal to a plurality of memory arrays in each signal distribution circuit are merely disposed dispersively. The total number of the components of the signal distribution circuits 50, 51 and 52 is the same. By placing the signal distribution circuits as shown in FIG. 20, it is unnecessary to route the two groups of the address-related lines 60 and 61, the control-related lines 63 and 64 and the data-related lines 66 and 67 over the memory chip 1. Wide layout reduction is therefore attained.

As described above, in this embodiment, since the signal distribution circuits are placed near each memory array, the data lines, the address lines and the control signal lines after the signal distribution can be shortened. This can reduce the wiring layout region and thus reduce the chip area. This embodiment is therefore useful for systems using large-scale memory.

Embodiment 14

Figure 23:
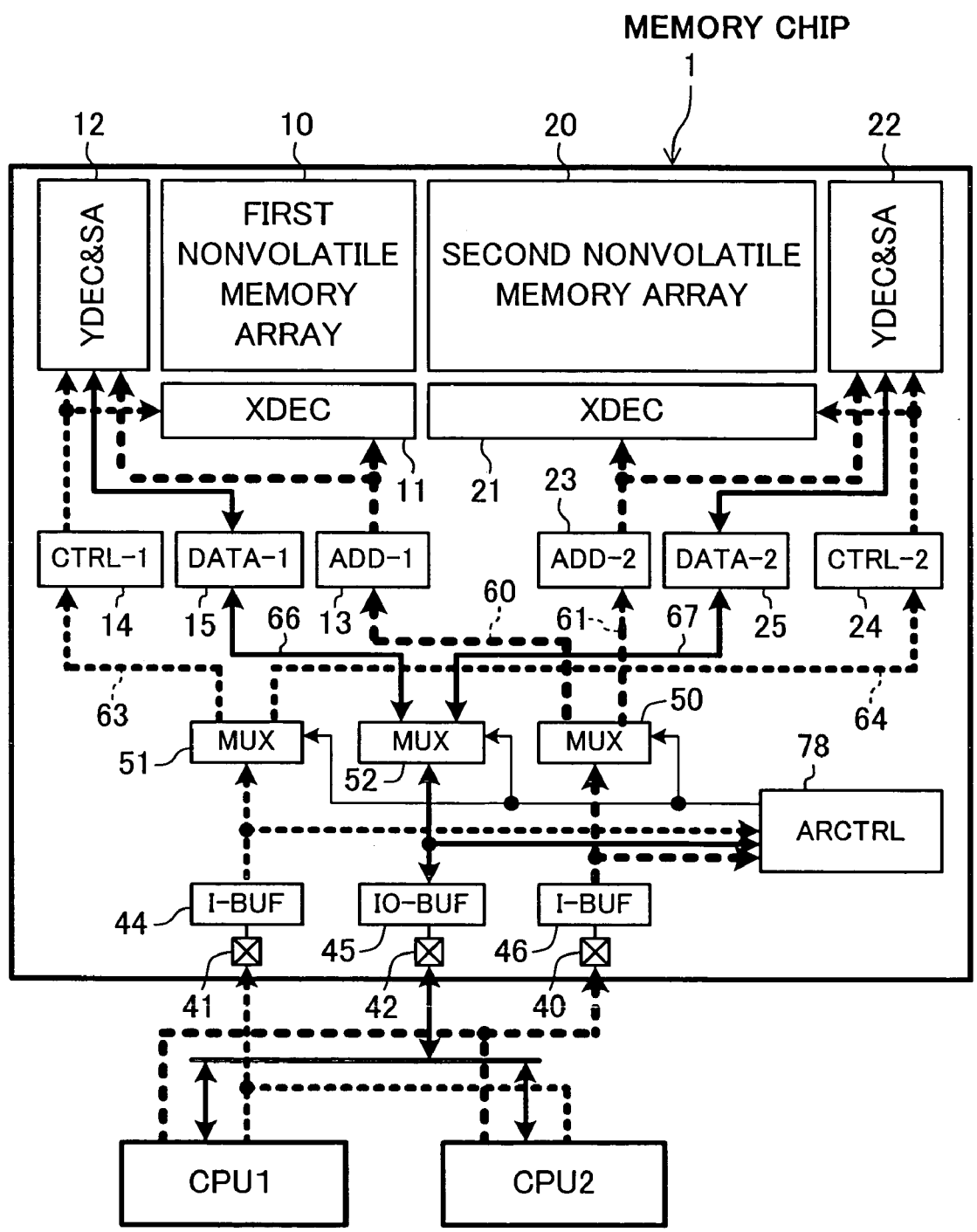
FIG. 23 is a block diagram of a semiconductor memory device of Embodiment 14.

FIG. 23 is a block diagram of a semiconductor memory device of Embodiment 14 of the present invention. The semiconductor memory device shown in FIG. 23 is similar to the device of Embodiment 1 shown in FIG. 1 in many portions, and thus only different portions are described in this embodiment.

As described in Embodiment 1, according to the present invention, a plurality of memory arrays 10 and 20 are provided in the memory chip 1, and each memory array 10, 20 is provided with its dedicated address-related circuit 13, 23, control-related circuit 14, 24 and data-related circuit 15, 25. With these circuits and also with the signal distribution circuits 50, 51 and 52 controlled with the memory array selection signal ASEL received from outside the memory chip 1, independent operation in each memory array 10, 20 is achieved.

In this embodiment, the memory array selection is made without use of the memory array selection signal ASEL. In some systems using memory, the highest-priority memory array is determined in advance among a plurality of memory arrays. In such a case, no external control on memory array selection is required. In this embodiment, an array selection control circuit ARCTRL 78 is provided in the memory chip 1. In use of the memory chip 1, the address, data and control signals from outside are input into the array selection control circuit ARCTRL 78 for specifying a highest-priority array. The array selection control circuit ARCTRL 78 generates a signal for selecting a highest-priority array based on the combination of the address, data and control lines from outside, and transmits the resultant signal to the signal distribution circuits 50, 51 and 52. If the priority-designated array is accessed, the address, data and control signals for any other array will not be accepted even though an access request for the array is issued. If the priority-designated array is not being accessed, access to any other array is allowed.

It should be noted that access as used herein refers to an event that the corresponding address, data and control signals for a desired memory array are input into the memory chip 1.

A specific example of the array selection is as follows. For example, when receiving signals for the priority-designated memory array, the array selection control circuit ARCTRL 78 generates a signal for signal distribution based on a preset priority designation scheme and transmits the generated signal to the signal distribution circuits 50, 51 and 52.

Although not shown, a busy signal may be issued when access to the highest-priority memory array is underway, to ensure no access is made to any other array.

As described above, in this embodiment, unlike other embodiments, no external array selection signal is used. The number of pins can therefore be reduced. Also, the array used can be changed with no arbitration on array selection being made in the system. Thus, the burden related to the control of the entire system can be alleviated.

Embodiment 15

Described so far were the inventive configurations and methods in which a plurality of arrays provided in a chip were selectively used from outside. In the above embodiments, arrays in a memory device are selected by providing an array selection signal and a clock externally on the precondition that a plurality of arrays are invariably accessed. In actual use, however, there is a case that high priority should desirably be given to one array. For example, in some cases, a program for system start-up in one array must be transferred to a separate buffer device upon activation. In such cases, if access is made alternately to a plurality of arrays in a manner as described above, the transfer efficiency will decrease causing decrease in system efficiency. That is, depending on the system operation, selecting only one array is also necessary. This embodiment deals with this problem.

Figure 24:
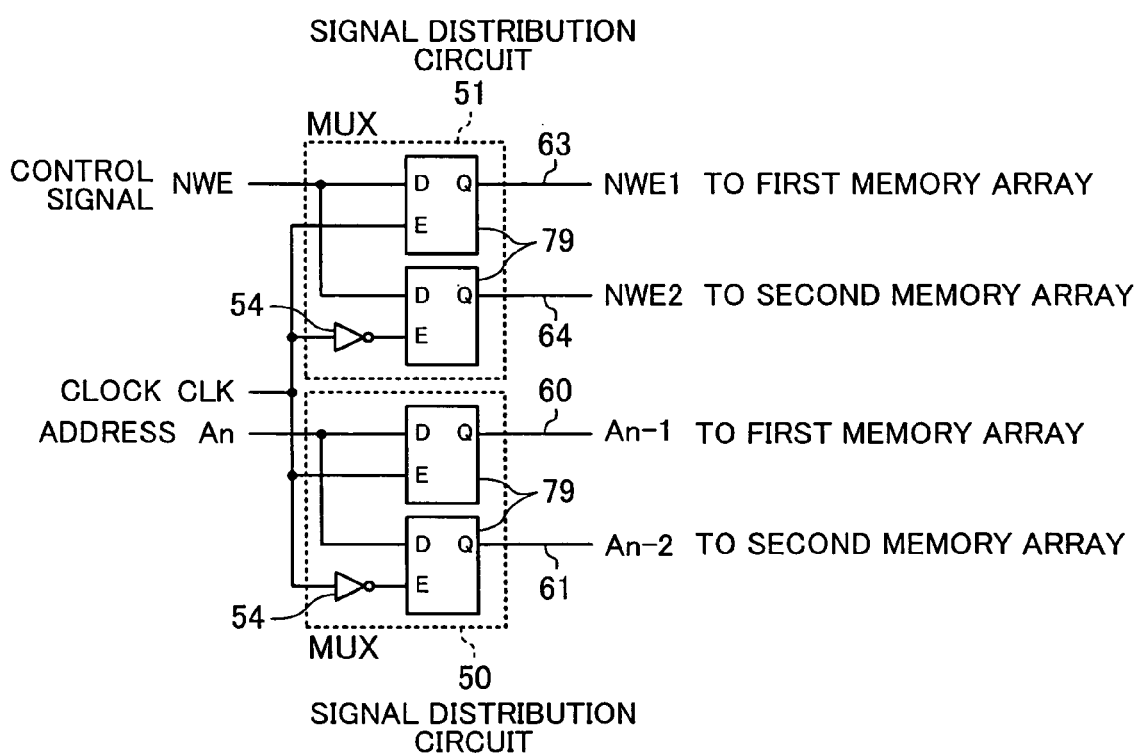
FIG. 24 is a view showing a signal distribution circuit of a semiconductor memory device of Embodiment 15.
Figure 25:
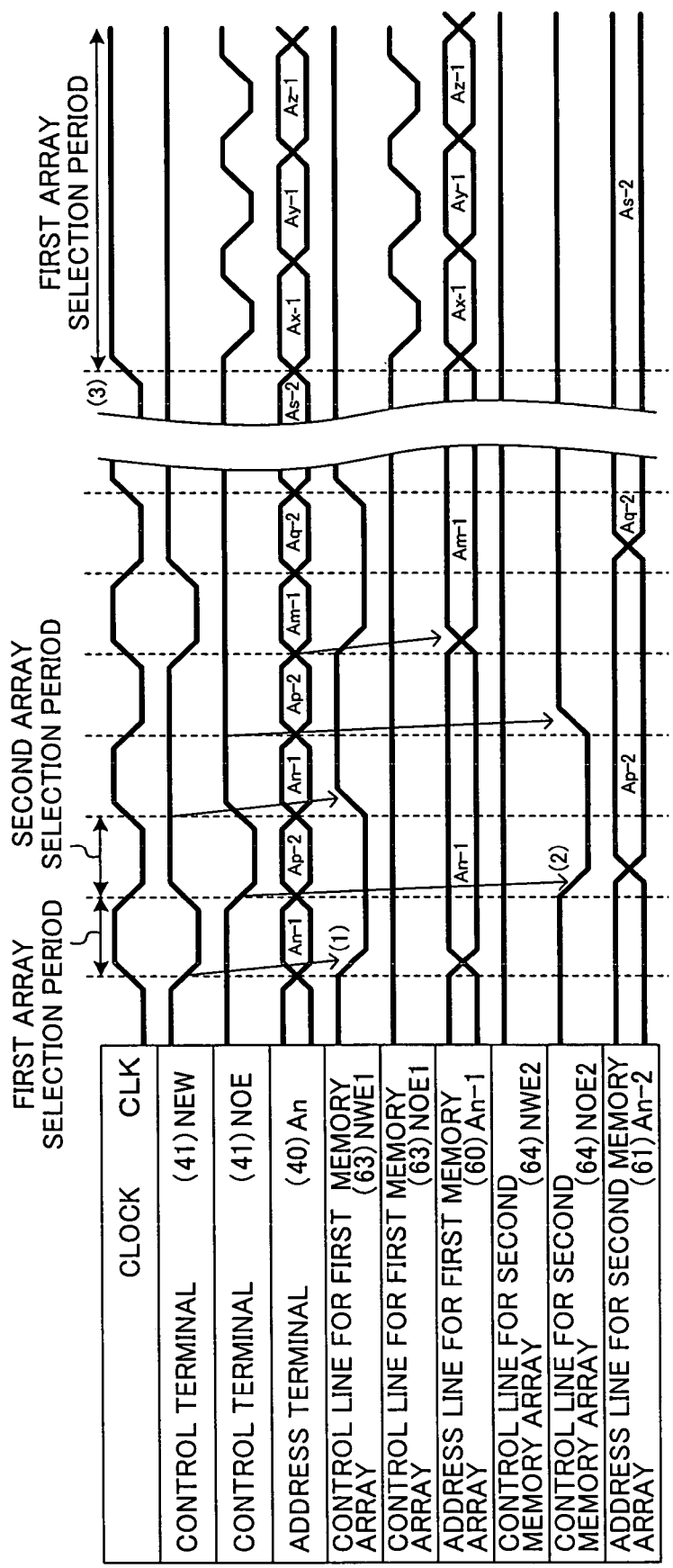
FIG. 25 is an operation sequence diagram of the semiconductor memory device of Embodiment 15.

FIG. 24 is a view showing signal distribution circuits of a semiconductor memory device of Embodiment 15 of the present invention. FIG. 25 is an operation sequence diagram observed when the signal distribution circuits in Embodiment 15 are used.

In this embodiment, a clock as a periodic signal is employed as the memory array selection signal ASEL. In FIG. 24, a control signal NWE is input into the signal distribution circuit 51, while an address signal An is input into the signal distribution circuit 50. In the example of FIG. 24, a clock CLK serves as the memory array selection signal for the signal distribution circuits 50 and 51. Each of the signal distribution circuits 50 and 51 includes two latches 79 and an inverter 54. As shown in FIG. 24, the clock CLK for one of the latches 79 directed to the second memory array is input into the latch 79 via the inverter 54. That is, both the signal distribution circuits 50 and 51 transmit a signal to the first memory array 10 during the 'H' period of the clock CLK and transmit a signal to the second memory array 20 during the 'L' period thereof.

FIG. 25 is a timing chart of the operations of the signal distribution circuits 50 and 51, in which the operations of control signals NWE and NOE and the address signal An are shown. As is found from FIG. 25, during the 'H' period of the clock CLK, the states of the control terminal 41 and the address terminal 40 are captured, and the signals are transmitted to the first memory array 10. Likewise, during the 'L' period of the clock CLK, the states of the control terminal 41 and the address terminal 40 are captured, and the signals are transmitted to the second memory array 20. In the example shown in FIG. 25, at timing (1), a control signal NWE1 on the control line 63 for the first memory array 10 shifts to 'L' while an address An-1 on the address line 60 shifts, and the shifted states are held until the next 'H' period. At timing (2), a control signal NOE2 on the control line 64 for the second memory array 20 shifts to 'L' while an address Ap-2 at the address line 61 shifts, and the shifted states are held until the next 'L' period. In this way, the control signals and the address signals are input independently for the first and second memory arrays 10 and 20, to enable these memory arrays to operate independently.

Although not shown, data input/output at the data terminal is performed in a similar way.

In this embodiment, the clock CLK is input, not only into the memory, but also into the CPU1 and CPU2 shown in FIG. 1. The CPU1 and CPU2 may merely transmit/receive signals to/from the memory in synchronization with the 'H' and 'L' periods of the clock CLK, and no arbitration is necessary on the access to the memory between the CPU1 and CPU2.

At timing (3), the clock CLK stops the periodic operation and is fixed to the 'H' level. Although not shown, this clock operation can be attained by providing a logic circuit on the output terminal of the clock CLK in the system and fixing the output of the clock CLK to the 'H' or 'L' level once a clock stop signal is received. In this embodiment, when the clock CLK is in the 'H' period, the memory array 10 is selected. That is, all the signals from the control terminal and the address terminal are transmitted to the memory array 10. During this period, the memory array 20 holds the previous state without any access from outside. In this way, by replacing the flipflop with the latch circuit in the signal distribution circuits and fixing the clock to 'H' or 'L', it is possible to select only one array.

As described above, in Embodiment 15, unlike Embodiments 3 and 4 described above in which selection of only one array is unavailable, access to only one array is allowed by fixing the level of the clock to 'H' or 'L'.

Since different memory arrays are selected during the 'H' period and the 'L' period, no bus arbitration is necessary among a plurality of information processing devices. Therefore, this embodiment is useful for systems using memory among a plurality of information processing devices.

Embodiment 16

In application of memory to various systems, the required memory capacity differs among the systems. In the inventive configurations that have a plurality of memory arrays provided in a chip, if the memory capacity is fixed, the use efficiency of the memory may decrease in some systems. This embodiment deals with this problem.

Figure 26:
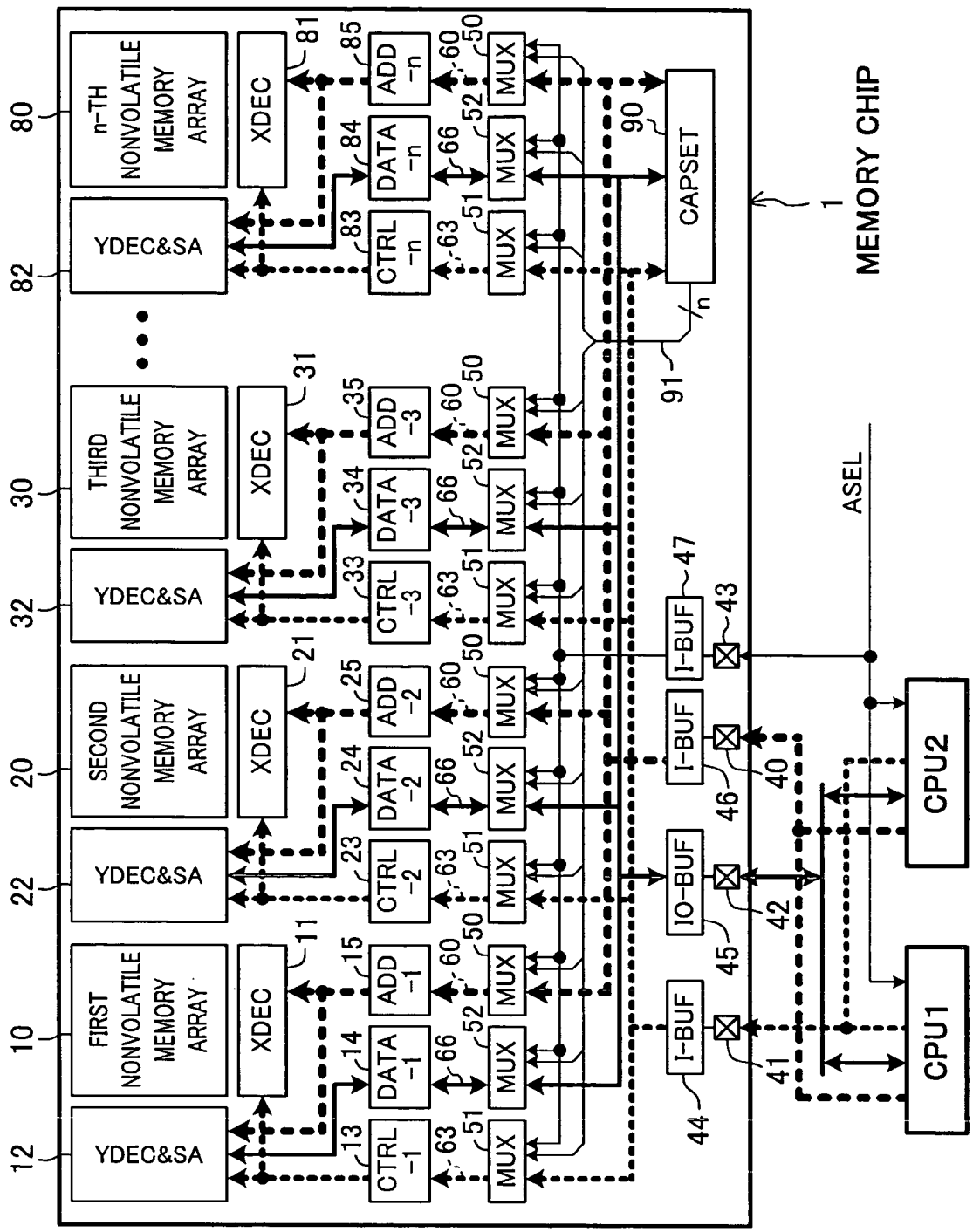
FIG. 26 is a block diagram of a semiconductor memory device of Embodiment 16.

FIG. 26 is a block diagram of a semiconductor memory device of Embodiment 16.

The semiconductor memory device shown in FIG. 26 is similar to the device of Embodiment 13 shown in FIG. 20 in many portions, and thus only different portions are described in this embodiment.

While two memory arrays are provided in FIG. 20, a total of n memory arrays from the first memory array 10 to the n-th memory array 80 are provided in this embodiment as shown in FIG. 26. Similarly, n row decoder blocks 11, 21, 31, 81 and n column decoder blocks 12, 22, 32, 82 are provided. Along with these arrays and blocks, n address-related circuits 13, 23, 33, 83, control-related circuits 14, 24, 34, 84 and data-related circuits 15, 25, 35, 85 are provided.

Also, in this embodiment, a memory capacity setting circuit CAPSET 90 is newly provided, which determines how the n memory arrays should be combined, that is, how many memory arrays should be selected simultaneously, to determine the capacity of the internal memory arrays from the number of simultaneously-selected memory arrays. In use of the memory chip 1, the memory capacity setting circuit CAPSET 90 receives the address, data and control signals from outside and determines the memory capacity of the memory arrays in the memory chip 1. Depending on the combination of the address, data and control signals from outside, the memory capacity setting circuit CAPSET 90 generates n memory capacity setting signals 91 for selecting a plurality of memory arrays partitioned in the memory chip 1, and transmits the generated signals to the signal distribution circuits 50, 51 and 52. For example, assume that the capacity of one of a total of 128 partitioned memory arrays is 2 Mbits (256 Mbits in the entire chip). If one of the 128 memory capacity setting signals 91 is in the 'H' level while the remainder are in the 'L' level, the memory chip 1 will be composed of one 2-Mbit memory array and one 254-Mbit memory array.

As described above, in this embodiment, the capacity setting can be made for a plurality of memory arrays. By partitioning the inside of the chip according to various settings, the memory can be used without waste.

Embodiment 17

Figure 27:
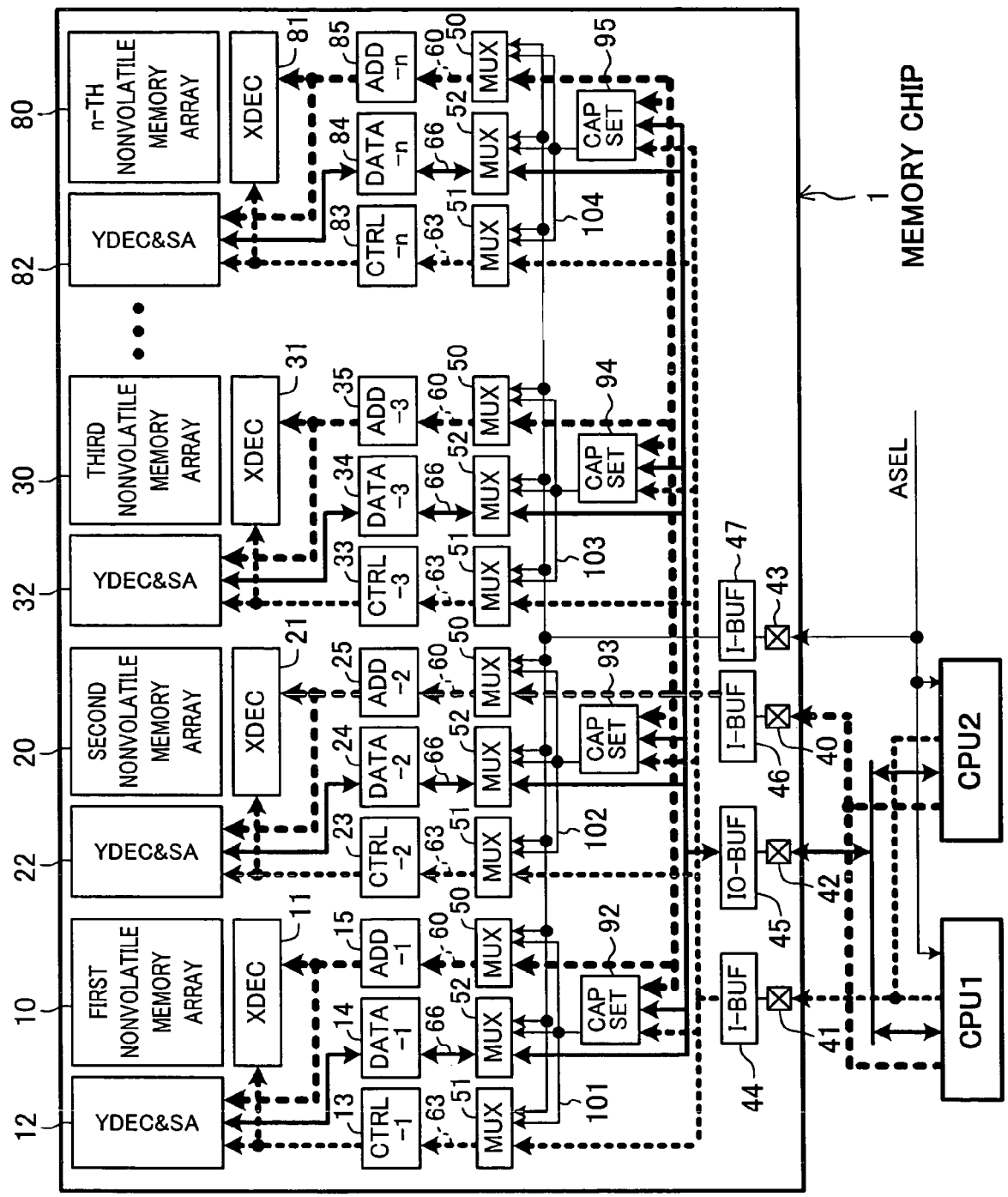
FIG. 27 is a block diagram of a semiconductor memory device of Embodiment 17.

FIG. 27 is a block diagram of a semiconductor memory device of Embodiment 17. The semiconductor memory device shown in FIG. 27 is similar to the device of Embodiment 16 shown in FIG. 26 in many portions, and thus only different portions are described in this embodiment.

In Embodiment 16, n memory arrays are provided in the memory chip 1, and n memory capacity setting signals are transmitted from the memory capacity setting circuit 90 to the signal distribution circuits 50, 51 and 52 for the respective memory arrays, to thereby set a desired memory capacity. With this configuration, a region for routing n lines is newly required as shown in FIG. 26, causing increase in the chip layout area. To deal with this problem, in this embodiment, the memory capacity setting circuit is divided into n memory capacity setting circuits 92, 93, 94, 95 that are placed near the signal distribution circuits 50, 51 and 52 for the respective memory arrays 10, 20, 30, 80.

Each of the n memory capacity setting circuits 92, 93, 94, 95 receives the address, data and control signals as in Embodiment 16, and sets a desired memory capacity depending on the combination of the inputs.

As described above, the memory capacity setting circuits 92, 93, 94, 95 are placed, not in the vicinity of the input/output buffers 44, 45, 46 at the chip external interface, but at positions near the signal distribution circuits 50, 51 and 52 for the respective memory arrays. By placing the memory capacity setting circuits as shown in FIG. 27, it is unnecessary to route lines for n memory capacity setting signals 101, 102, 103, 104 over the memory chip 1. Wide layout reduction is therefore attained.

As described above, in this embodiment, the memory capacity setting circuit is divided to be placed near the signal distribution circuits for each memory array. This can reduce the number of routing lines for the memory capacity setting signals. As a result, the wiring layout region can be reduced, and thus the chip area can be reduced. This embodiment is therefore useful for systems using large-scale memory.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A one-chip semiconductor memory device transmitting/receiving a data signal, an address signal and a control signal to/from a plurality of information processing devices, the device comprising
   a plurality of memory arrays each having an array of a plurality of nonvolatile memory cells in the chip;
   a plurality of sets of data terminals, address terminals and control terminals and data-related circuits, address-related circuits and control-related circuits provided individually for the plurality of memory arrays;
   one set of a data terminal, address terminal and control terminal placed in an input/output buffer portion at a chip external interface, the one set being shared among the plurality of memory arrays; and
   a plurality of signal selection circuits placed between the one set of a data terminal, address terminal and control terminal and the plurality of sets of data terminals, address terminals and control terminals and data-related circuits, address-related circuits and control-related circuits,
   wherein one or a plurality of array selection signals for selecting any of the plurality of memory arrays are input into the plurality of signal selection circuits via the input/output buffer portion, and
   signals from the one set of a data terminal, address terminal and control terminal are distributed to any of the plurality of memory arrays via the plurality of signal distribution circuits.

2. The semiconductor memory device of claim 1, wherein a plurality of sets of data signals, address signals and control signals are input or output at the data terminal, the address terminal and the control terminal in the input/output buffer portion in a time-division manner.

3. The semiconductor memory device of claim 1, wherein a clock input into the plurality of information processing devices is input into the plurality of signal distribution circuits as the array selection signal, and
   the plurality of signal distribution circuits distribute signals so that
   a data input signal, an address signal and a control signal input into the input/output buffer portion are supplied to a first memory array as one of the plurality of memory arrays at rising or falling timing of the clock,
   a data input signal, an address signal and a control signal input into the input/output buffer portion are supplied to a second memory array as another memory array at falling or rising timing of the clock, and
   data from the first memory array is output from the input/output buffer portion at subsequent rising or falling timing of the clock, and data from the second memory array is output from the input/output buffer portion at subsequent falling or rising timing of the clock.

4. The semiconductor memory device of claim 1, wherein a clock input into the plurality of information processing devices is input into the plurality of signal distribution circuits as the array selection signal, and
   the plurality of signal distribution circuits distribute signals so that
   a data input signal and an address signal input into the input/output buffer portion are supplied to a first memory array as one of the plurality of memory arrays, while a control signal input into the input/output buffer portion is supplied to a second memory array as another memory array, at rising or falling timing of the clock,
   a data input signal and an address signal input into the input/output buffer portion are supplied to the second memory array, while a control signal input into the input/output buffer portion is supplied to the first memory array, at falling or rising timing of the clock, and
   data from the first memory array is output from the input/output buffer portion at subsequent rising or failing timing of the clock, and data from the second memory array is output from the input/output buffer portion at subsequent falling or rising timing of the clock.

5. The semiconductor memory device of claim 1, wherein a clock input into the plurality of information processing devices and a memory activation signal output from any of the plurality of information processing devices are supplied,
   a count circuit controlled with the memory activation signal and the clock is provided in the chip,
   the count circuit counts the clock after the input of the memory activation signal, generates a plurality of kinds of memory array selection signals according to the count number, and transmits the generated signals to the plurality of signal distribution circuits, and
   the plurality of signal distribution circuits are controlled with the plurality of kinds of memory array selection signals.

6. A transmission/reception system comprising:
   the semiconductor memory device of claim 5; and a plurality of information processing devices connected to the semiconductor memory device, wherein the count circuit receives the memory activation signal and counts the clock after the input of the memory activation signal, and the plurality of signal distribution circuits distribute signals so that signal transmission/reception is made between any one of the plurality of information processing devices and the semiconductor memory device in a cycle every predetermined number of cycles of the clock based on the clock count result from the count circuit, and signal transmission/reception is made between another information processing device and the semiconductor memory device in a subsequent cycle of the clock.

7. The semiconductor memory device of claim 5, wherein the count circuit counts the clock or a multiplied clock without receiving the memory activation signal, generates the plurality of kinds of memory array selection signals according to the count number, and transmits the generated signals to the plurality of signal distribution circuits, and the plurality of signal distribution circuits are controlled with the plurality of kinds of memory array selection signals.

8. The semiconductor memory device of claim 5, wherein the count circuit counts the clock or a multiplied clock without receiving the memory activation signal, and the plurality of signal distribution circuits distribute signals so that signal transmission/reception is made between any one of the plurality of information processing devices and the semiconductor memory device in a cycle every predetermined number of cycles of the multiplied clock based on the count result of the clock from the count circuit, and signal transmission/reception is made between another information processing device and the semiconductor memory device in a subsequent cycle of the multiplied clock.

9. The semiconductor memory device of claim 5, further comprising a status setting circuit for receiving a signal group from the data terminal, the address terminal and the control terminal in the input/output buffer portion and varying the relationship between the count number in the count circuit and the generation of the memory array selection signals according to the signal group, and the output of the status setting circuit is given to the count circuit.

10. The semiconductor memory device of claim 9, wherein a control signal is transmitted from any of the plurality of information processing devices to the status setting circuit via the data terminal, the address terminal and the control terminal, and the contents of the status setting circuit are changed with the control signal.

11. The semiconductor memory device of claim 1, wherein a clock input into the plurality of information processing devices and a memory activation signal output from any of the plurality of information processing devices are supplied, a clock multiplication circuit for multiplying the frequency of the clock and a count circuit controlled with the memory activation signal and a multiplied clock from the clock multiplication circuit are provided in the chip, the count circuit counts the multiplied clock after the input of the memory activation signal, generates a plurality of kinds of memory array selection signals according to the count number, and transmits the generated signals to the plurality of signal distribution circuits, and the plurality of signal distribution circuits are controlled with the plurality of kinds of memory array selection signals.

12. A transmission/reception system comprising:
the semiconductor memory device of claim 11; and
a plurality of information processing devices connected to the semiconductor memory device, wherein each of the information processing devices has the clock multiplication circuit and the count clock, the clock multiplication circuit multiplies the cycles of the input clock, the count circuit receives the memory activation signal and counts the multiplied clock after the input of the memory activation signal, and the plurality of signal distribution circuits distribute signals so that signal transmission/reception is made between any one of the plurality of information processing devices and the semiconductor memory device in a cycle every predetermined number of cycles of the multiplied clock based on the count result of the multiplied clock from the count circuit, and signal transmission/reception is made between another information processing device and the semiconductor memory device in a subsequent cycle of the multiplied clock.

13. A transmission/reception system comprising:
the semiconductor memory device of claim 1; and
a plurality of information processing devices connected to the semiconductor memory device, wherein the semiconductor memory device receives a clock, a memory activation signal is transmitted from a first information processing device among the plurality of information processing devices to the semiconductor memory device and the other information processing device or devices, the semiconductor memory device has a clock multiplication circuit for multiplying the frequency of the clock and a count circuit for receiving the multiplied clock from the clock multiplication circuit, the multiplied clock from the clock multiplication circuit is transmitted to the plurality of information processing devices, the count circuit of the semiconductor memory circuit counts the multiplied clock after the input of the memory activation signal, generates a plurality of kinds of memory array selection signals according to the count number and transmits the generated signals to the plurality of signal distribution circuits, and the plurality of signal distribution circuits are controlled with the plurality of kinds of memory array selection signals, so that signal transmission/reception is made between the semiconductor memory device and the plurality of information processing devices.

14. The transmission/reception system of claim 13, wherein the plurality of information processing devices have a count circuit, the count circuit receives the multiplied clock from the clock multiplication circuit of the semiconductor memory device and counts the multiplied clock after the input of the memory activation signal, and the plurality of signal distribution circuits distribute signals so that signal transmission/reception is made between any one of the plurality of information processing devices and the semiconductor memory device in a cycle every predetermined number of cycles of the multiplied clock based on the count result of the clock by the count circuit, and signal transmission/reception is made between another information processing device and the semiconductor memory device in a subsequent cycle of the multiplied clock.

15. The semiconductor memory device of claim 1, wherein a memory activation signal is transmitted from one of the plurality of information processing devices to the semiconductor memory device and the other information processing device or devices, and the plurality of signal distribution circuits perform signal transmission/reception between the plurality of information processing devices and the plurality of memory arrays based on the memory activation signal, so that a data input signal, an address signal and a control signal input into the input/output buffer portion are supplied to one memory array during an 'H' or 'L' period of the memory activation signal, while a data input signal, an address signal and a control signal input into the input/output buffer portion are supplied to another memory array during an 'L' or 'H' period of the memory activation signal, and data from the one memory array is output from the input/output buffer portion during a subsequent 'H' or 'L' period of the memory activation signal, while data from the another memory array is output from the input/output buffer portion during a subsequent 'L' or 'H' period of the memory activation signal.

16. The semiconductor memory device of claim 15, wherein the plurality of signal distribution circuits distribute signals so that a data input signal, an address signal and a control signal input into the input/output buffer portion are supplied to one memory array at rising or falling timing of the memory activation signal, while a data input signal, an address signal and a control signal input into the input/output buffer portion are supplied to another memory array at falling or rising timing of the memory activation signal, the signals input into the input/output buffer portion are held in the two memory arrays until the next rising or falling shift, and data from the one memory array is output from the input/output buffer portion at rising or falling timing of the memory activation signal, while data from the another memory array is output from the input/output buffer portion at falling or rising timing of the memory activation signal.

17. The semiconductor memory device of claim 15, wherein during the period when the memory activation signal transmitted from the one information processing device is being activated, signal transmission/reception between the other information processing device or devices and the semiconductor memory device is not performed.

18. The semiconductor memory device of claim 1, wherein a memory activation signal is transmitted from each of the plurality of information processing devices to the semiconductor memory device, and the plurality of signal distribution circuits are respectively controlled with the plurality of memory activation signals, so that a data input signal, an address signal and a control signal input into the input/output buffer portion are supplied to one memory array during an 'H' or 'L' period of one of the plurality of the memory activation signals, and data from the one memory array is output from the input/output buffer portion, while a data input signal, an address signal and a control signal input into the input/output buffer portion are supplied to another memory array during an 'H' or 'L' period of another one of the plurality of the memory activation signals, and data from the another memory array is output from the input/output buffer portion.

19. The semiconductor memory device of claim 18, wherein a memory activation signal is transmitted from each of the plurality of information processing devices to the semiconductor memory device, and the plurality of signal distribution circuits are respectively controlled with the plurality of memory activation signals, so that a data input signal, an address signal and a control signal input into the input/output buffer portion are supplied to one memory array at falling or rising timing of one of the plurality of the memory activation signals, the signals supplied to the one memory array are held in the one memory array until the next rising or falling shift of the one memory activation signal, and data from the one memory array is output from the input/output buffer portion, while a data input signal, an address signal and a control signal input into the input/output buffer portion are supplied to another memory array at falling or rising timing of another one of the plurality of the memory activation signals, the signals supplied to the another memory array are held in the another memory array until the next rising or falling shift of the another memory activation signal, and data from the another memory array is output from the input/output buffer portion.

20. A transmission/reception system comprising:
the semiconductor memory device of claim 18; and
the plurality of information processing devices,
wherein a memory access request signal is transmitted to a first information processing device among the plurality of information processing devices from each of the other information processing device or devices,
a memory busy signal is transmitted from the first information processing device to each of the other information processing device or devices, and
the other information processing device or devices that have received the memory busy signal from the first information processing device do not activate the memory activation signal and thus do not perform signal transmission/reception.

21. A transmission/reception system comprising:
the semiconductor memory device of claim 1; and
the plurality of information processing devices,
wherein the semiconductor memory device includes a timer circuit,
the timer circuit generates a memory array switch signal having a pulse of a predetermined width in a predetermined cycle, and outputs the signal to the plurality of information processing devices, and
in the plurality of information processing devices, during the time when the memory array switch signal is being activated, the state of a memory activation signal generated by any of the information processing devices is shifted, and output signals from all the information processing devices to the semiconductor memory device are fixed to 'H', 'L' or high impedance.

22. The semiconductor memory device of claim 1, wherein the plurality of signal distribution circuits are placed, not in the vicinity of the input/output buffer portion at the chip external interface, but at positions near the plurality of memory arrays on the chip.

23. The semiconductor memory device of claim 1, further comprising an array selection control circuit for generating a signal for controlling to distribute signals from the one set of a data terminal, address terminal and control terminal to any of the plurality of memory arrays via the plurality of signal distribution circuits, wherein in use of the semiconductor memory device, the array selection control circuit is configured to receive signals from the data terminal, the address terminal and the control terminal, generate an array selection signal for selecting one memory array among the plurality of memory arrays, and transmit the array selection signal to the signal distribution circuits in advance, and if the memory array selected in advance with the array selection control circuit is accessed externally, access to the other memory array or arrays is not accepted, and only when the memory array selected in advance is not being accessed, access to the other memory array or arrays is accepted, thus performing selection giving high priority to one memory array.

24. The semiconductor memory device of claim 1, wherein a clock input into the plurality of information processing devices is input into the plurality of signal distribution circuits as the array selection signal, and the plurality of signal distribution circuits distribute signals so that a data input signal, an address signal and a control signal input into the input/output buffer portion are supplied to a first memory array as one of the plurality of memory arrays during an 'H' or 'L' period of the clock, while in a second memory array as another memory array, a previously-input signal is held, a data input signal, an address signal and a control signal input into the input/output buffer portion are supplied to the second memory array during an 'L' or 'H' period of the clock, while in the first memory array, a previously-input signal is held, and data from the first memory array is output from the input/output buffer portion during an 'H' or 'L' period of the clock, while data from the second memory array is output from the input/output buffer portion during an 'L' or 'H' period of the clock.

25. The semiconductor memory device of claim 1, wherein the device has n (n is an integer equal to or more than 2) memory arrays, and n signal distribution circuits for address signal, n signal distribution circuits for data signal and n signal distribution circuits for control signal respectively provided for the n memory arrays, the device further comprises a memory capacity setting circuit, in use of the semiconductor memory device, the memory capacity setting circuit is configured to receive signals from the data terminal, the address terminal and the control terminal, and transmit array selection signals to the signal distribution circuits so that one memory array or a plurality of memory arrays having a desired memory capacity are made up from the n memory arrays based on the input signals in advance, and the memory capacity setting circuit transmits n array selection signals to the n signal distribution circuits each for address signal, data signal and control signal to select a memory array having a desired memory capacity.

26. The semiconductor memory device of claim 25, wherein the memory capacity setting circuit is divided into a plurality of circuits, the plurality of memory capacity setting circuits are placed, not in the vicinity of the input/output buffer portion at the chip external interface, but at positions near the plurality of memory arrays on the chip.

* * * * *